United States Patent
Kondo et al.

(10) Patent No.: US 11,037,844 B2
(45) Date of Patent: Jun. 15, 2021

(54) POWER SEMICONDUCTOR DEVICE AND METHOD OF MANUFACTURING THE SAME, AND POWER CONVERSION DEVICE

(71) Applicant: Mitsubishi Electric Corporation, Tokyo (JP)

(72) Inventors: Satoshi Kondo, Tokyo (JP); Yusuke Kaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/858,418

(22) Filed: Dec. 29, 2017

(65) Prior Publication Data

US 2018/0294201 A1    Oct. 11, 2018

(30) Foreign Application Priority Data

Apr. 6, 2017   (JP) .............................. JP2017-076013

(51) Int. Cl.
  *H01L 23/04*   (2006.01)
  *H01L 23/24*   (2006.01)
  (Continued)

(52) U.S. Cl.
  CPC ............ *H01L 23/041* (2013.01); *H01L 21/52* (2013.01); *H01L 21/54* (2013.01); *H01L 23/04* (2013.01);
  (Continued)

(58) Field of Classification Search
  CPC . H01L 23/3121; H01L 23/041; H01L 23/051; H01L 23/047; H01L 21/52;
  (Continued)

(56) References Cited

U.S. PATENT DOCUMENTS 5,942,797 A * 8/1999 Terasawa ............... H01L 25/162
                                                       257/703
8,004,075 B2 * 8/2011 Soga ........................ H01L 23/24
                                                       257/687

(Continued)

FOREIGN PATENT DOCUMENTS

JP     2013-074035 A    4/2013
JP     2015-159258 A    9/2015
(Continued)

OTHER PUBLICATIONS

An Office Action issued by the German Patent Office dated Jan. 11, 2019, which corresponds to German Patent Application No. 10 2018 203 228.9 and is related to U.S. Appl. No. 15/858,418; with English language translation.

(Continued)

*Primary Examiner* — Mark W Tornow
*Assistant Examiner* — Abbigale A Boyle
(74) *Attorney, Agent, or Firm* — Studebaker & Brackett PC

(57) ABSTRACT

A power semiconductor device includes a casing, a first insulating circuit board, a second insulating circuit board, and a sealing material. The first insulating circuit board is disposed to be surrounded by the casing. The second insulating circuit board is surrounded by the casing and spaced from the first insulating circuit board so as to sandwich a semiconductor element between the first insulating circuit board and the second insulating circuit board. The sealing material fills a region surrounded by the casing. The first or second insulating circuit board is provided with a hole extending from one main surface to the other main surface opposite to one main surface. From at least a portion of an inner wall surface of the casing a protrusion extending to a region overlapping the first or second insulating circuit
(Continued)

board in a plan view extends toward the region surrounded by the casing.

10 Claims, 16 Drawing Sheets

(51) Int. Cl.
| | |
|---|---|
| *H01L 21/54* | (2006.01) |
| *H01L 23/22* | (2006.01) |
| *H01L 23/053* | (2006.01) |
| *H01L 23/047* | (2006.01) |
| *H01L 21/52* | (2006.01) |
| *H01L 23/14* | (2006.01) |
| *H01L 23/31* | (2006.01) |
| *H01L 23/498* | (2006.01) |
| *H02M 7/00* | (2006.01) |
| *H01L 23/367* | (2006.01) |
| *H02M 7/5387* | (2007.01) |

(52) U.S. Cl.
CPC .......... *H01L 23/047* (2013.01); *H01L 23/053* (2013.01); *H01L 23/142* (2013.01); *H01L 23/22* (2013.01); *H01L 23/24* (2013.01); *H01L 23/3121* (2013.01); *H01L 23/49844* (2013.01); *H01L 23/367* (2013.01); *H01L 2224/33* (2013.01); *H02M 7/003* (2013.01); *H02M 7/5387* (2013.01)

(58) Field of Classification Search
CPC . H01L 23/04; H01L 23/053; H01L 23/49844; H02M 7/5387
See application file for complete search history.

(56) References Cited

U.S. PATENT DOCUMENTS

| | | | |
|---|---|---|---|
| 8,981,552 B2* | 3/2015 | Shimoike | ................ H01L 24/29 |
| | | | 257/693 |
| 2014/0118956 A1* | 5/2014 | Kim | ........................ H01L 24/37 |
| | | | 361/728 |
| 2015/0221525 A1* | 8/2015 | Otsuki | .................... H01L 24/49 |
| | | | 164/98 |
| 2016/0181175 A1 | 6/2016 | Ikeda | |

FOREIGN PATENT DOCUMENTS

| | | |
|---|---|---|
| JP | 5788585 B2 | 9/2015 |
| JP | 2016-025154 A | 2/2016 |

OTHER PUBLICATIONS

An Office Action mailed by the Chinese Patent Office dated Apr. 6, 2021, which corresponds to Chinese Patent Application No. 201810299527.7 and is related to U.S. Appl. No. 15/858,418.

* cited by examiner

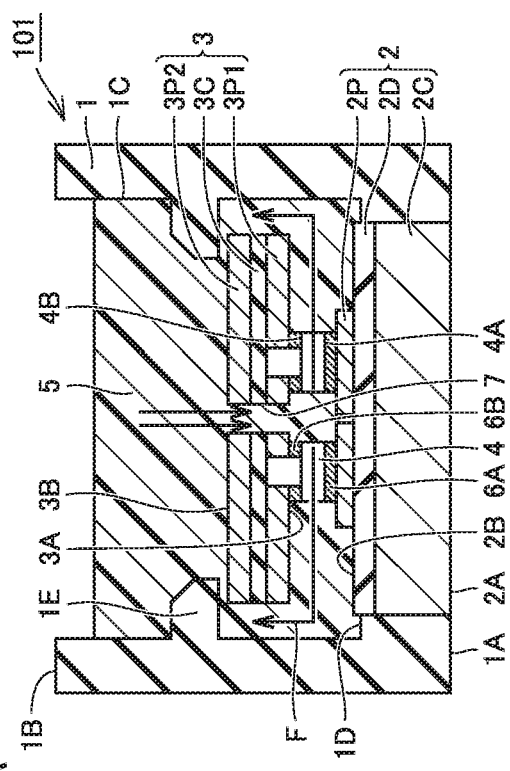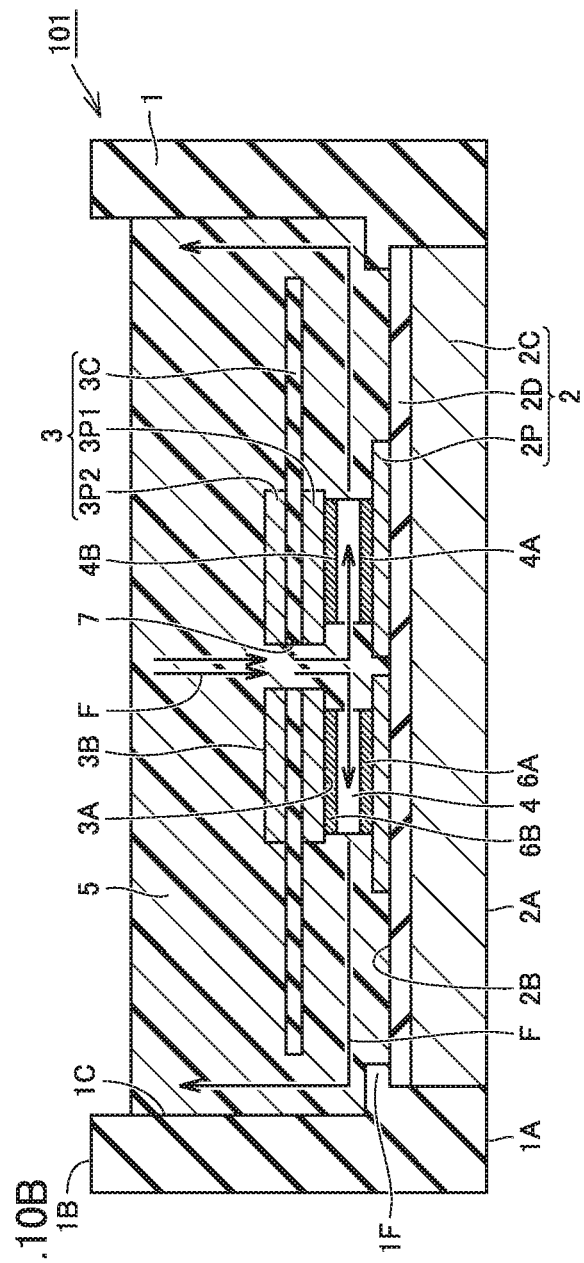

POWER SEMICONDUCTOR DEVICE AND METHOD OF MANUFACTURING THE SAME, AND POWER CONVERSION DEVICE

BACKGROUND OF THE INVENTION

Field of the Invention

The present invention relates to a power semiconductor device and a method of manufacturing the same, and more particularly to a power semiconductor device including two types of insulating circuit boards and a semiconductor element sandwiched therebetween, and a method of manufacturing the same. The present invention also relates to a power conversion device to which the power semiconductor device is applied.

Description of the Background Art

Japanese Patent Laying-Open Nos. 2016-25154, 2013-74035 and 2015-159258 disclose a semiconductor device having a protrusion or a similar structure disposed therein in order to control how a sealing material flows when it is supplied and thus introduced into a die with a semiconductor element or the like placed in the die.

SUMMARY OF THE INVENTION

A general power semiconductor device has a configuration in which a semiconductor element and circuit patterns are electrically connected via a metal wire, a metal member, or the like, as described in the above patent documents. However, for further higher density and higher reliability, a power semiconductor device having a configuration in which an insulating circuit board capable of conducting a large current is mounted so as to be superimposed on a semiconductor element is being increasingly developed.

That is, such a power semiconductor device has a configuration in which a semiconductor element is mounted on a first insulating circuit board, and a second insulating circuit board is disposed thereon and connected. The power semiconductor device having the above structure, however, has a portion in which the first insulating circuit board and the second insulating circuit board have a narrow spaced portion therebetween. It is difficult to introduce a sealing material into such a narrow spaced portion, and the power semiconductor device has the problem that it is difficult to fill such a portion with an insulating sealing material without a gap. However, the above patent documents do not provide such a structure in which an insulating circuit board is mounted on and thus overlaps a semiconductor element, and the patent documents do not disclose a technique to better introduce a sealing material into a narrow spaced portion between two insulating circuit boards.

The present invention has been made in view of the above issue, and it is an object of the present invention to provide a power semiconductor device in which an insulating sealing material is introduced into a narrow spaced portion between two insulating circuit boards without a gap and a method of manufacturing the same, and a power conversion device having such a power semiconductor device.

According to the present invention, a power semiconductor device comprises a casing, a first insulating circuit board, a second insulating circuit board, and a sealing material. The first insulating circuit board is disposed to be surrounded by the casing. The second insulating circuit board is surrounded by the casing and spaced from the first insulating circuit board so as to sandwich a semiconductor element between the first insulating circuit board and the second insulating circuit board. The sealing material fills a region surrounded by the casing. The first or second insulating circuit board is provided with a hole extending from one main surface to the other main surface opposite to one main surface. From at least a portion of an inner wall surface of the casing a protrusion extending to a region overlapping the first or second insulating circuit board in a plan view extends toward the region surrounded by the casing.

According to the present invention, a power semiconductor device comprises a casing, a first insulating circuit board, a second insulating circuit board, and a sealing material. The first insulating circuit board is disposed to be surrounded by the casing. The second insulating circuit board is surrounded by the casing and spaced from the first insulating circuit board so as to sandwich a semiconductor element between the first insulating circuit board and the second insulating circuit board. The sealing material fills a region surrounded by the casing. The casing has at least a portion with a hole extending from an outermost surface of the casing to reach an inner wall surface opposite to the outermost surface. From at least a portion of the inner wall surface of the casing a protrusion extending to a region overlapping the first or second insulating circuit board in a plan view extends toward the region surrounded by the casing.

According to the present invention, in a method of manufacturing a power semiconductor device, a second insulating circuit board is initially joined over one main surface of a first insulating circuit board so as to sandwich a semiconductor element between the first insulating circuit board and the second insulating circuit board. The first insulating circuit board, the semiconductor element and the second insulating circuit board are disposed to be surrounded by a casing. The semiconductor element is sealed by supplying a sealing material to a region surrounded by the casing. The first or second insulating circuit board is provided with a hole extending from one main surface to the other main surface. From at least a portion of an inner wall surface of the casing a protrusion extending to a region overlapping the first or second insulating circuit board in a plan view extends toward the region surrounded by the casing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10A and 10B show a flow of a sealing material in the method of manufacturing the power module according to the first embodiment at a sealing step similar to that of FIGS. 7A and 7B in a schematic cross section seen in a cross section taken along line A-A in FIG. 1 including a portion on the longer side of the case and a schematic cross section seen in a cross section taken along line C-C in FIG. 1 including a portion on the longer side of the case, respectively.

DESCRIPTION OF THE PREFERRED EMBODIMENTS

Hereinafter reference will be made to the drawings to describe the present invention in embodiments.

First Embodiment

Figure 1:
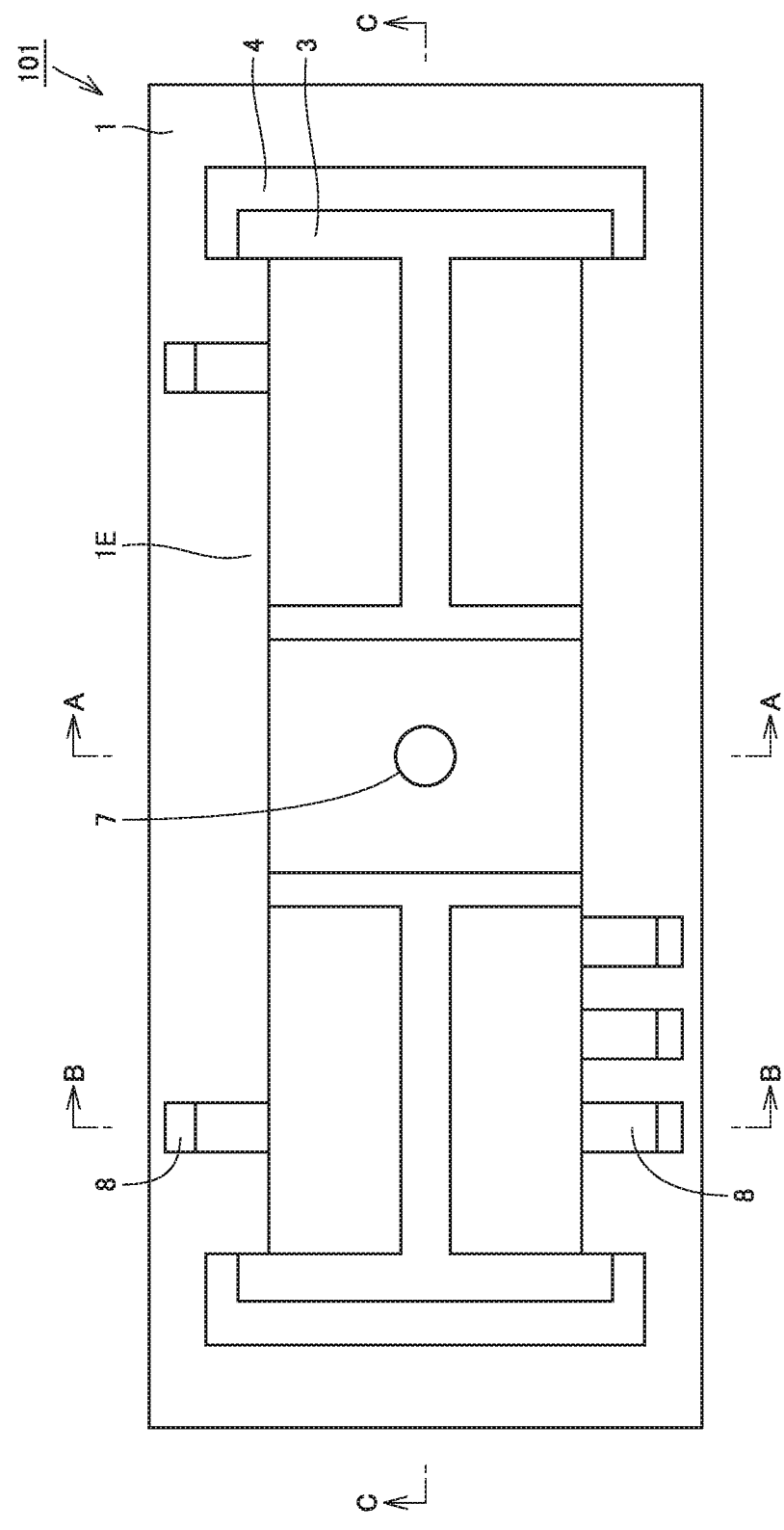
FIG. 1 is a schematic plan view showing a configuration of a power module according to a first embodiment.
Figure 2A:
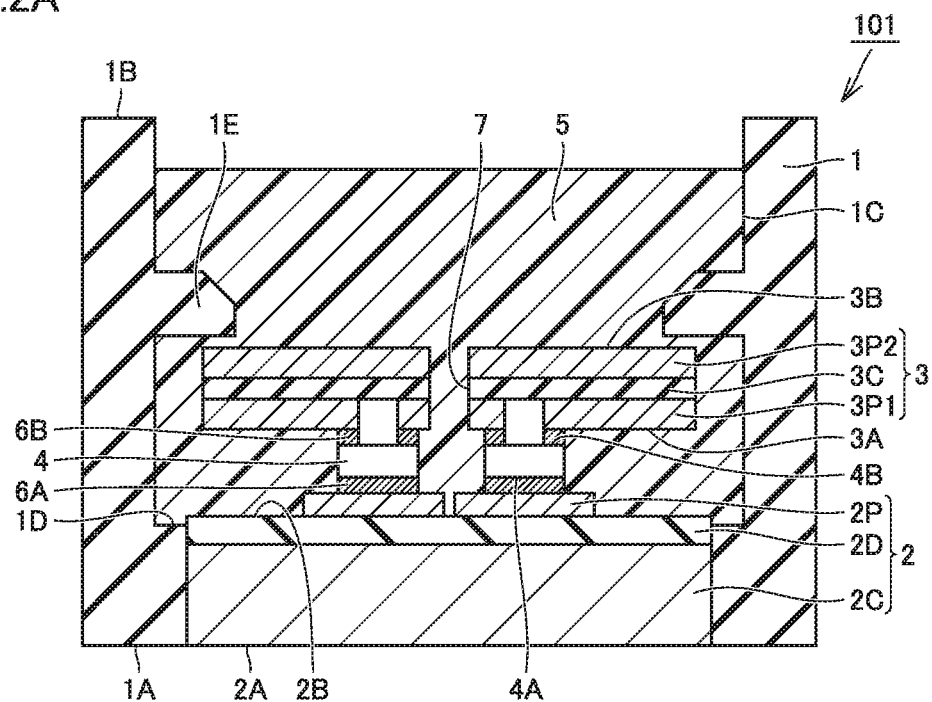
FIG. 2A is a schematic cross section of a configuration including a portion along a line A-A in FIG. 1, that is, a portion on a longer side of a case of the power module of the first embodiment.
Figure 2B:
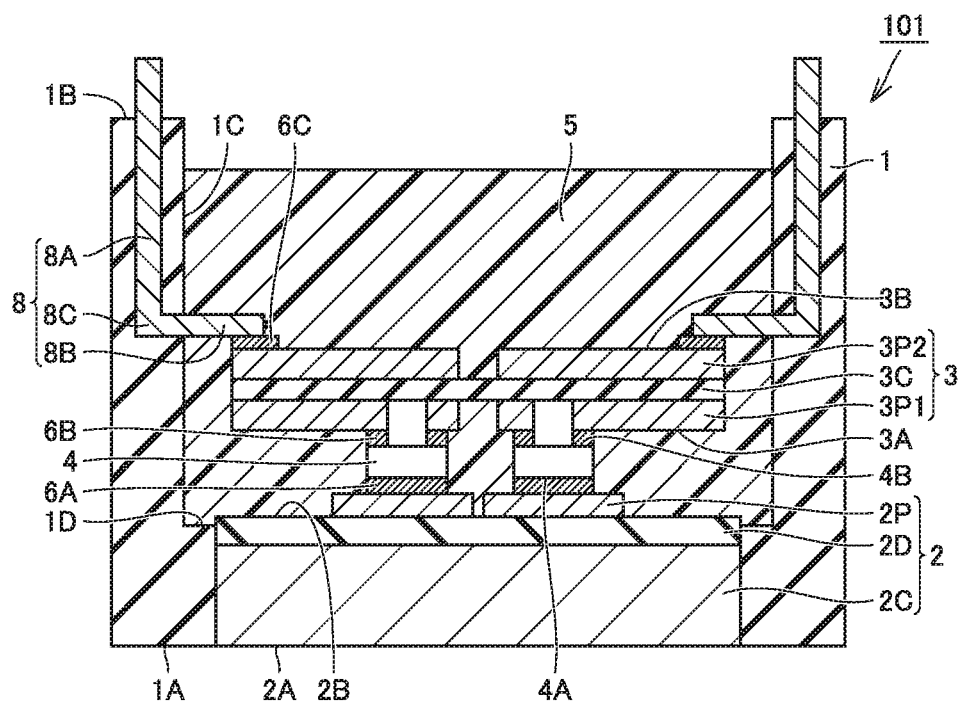
FIG. 2B is a schematic cross section of a configuration including a portion along a line B-B in FIG. 1, that is, a portion which is a longer side of the case of the power module of the first embodiment and includes an external output terminal.
Figure 3:
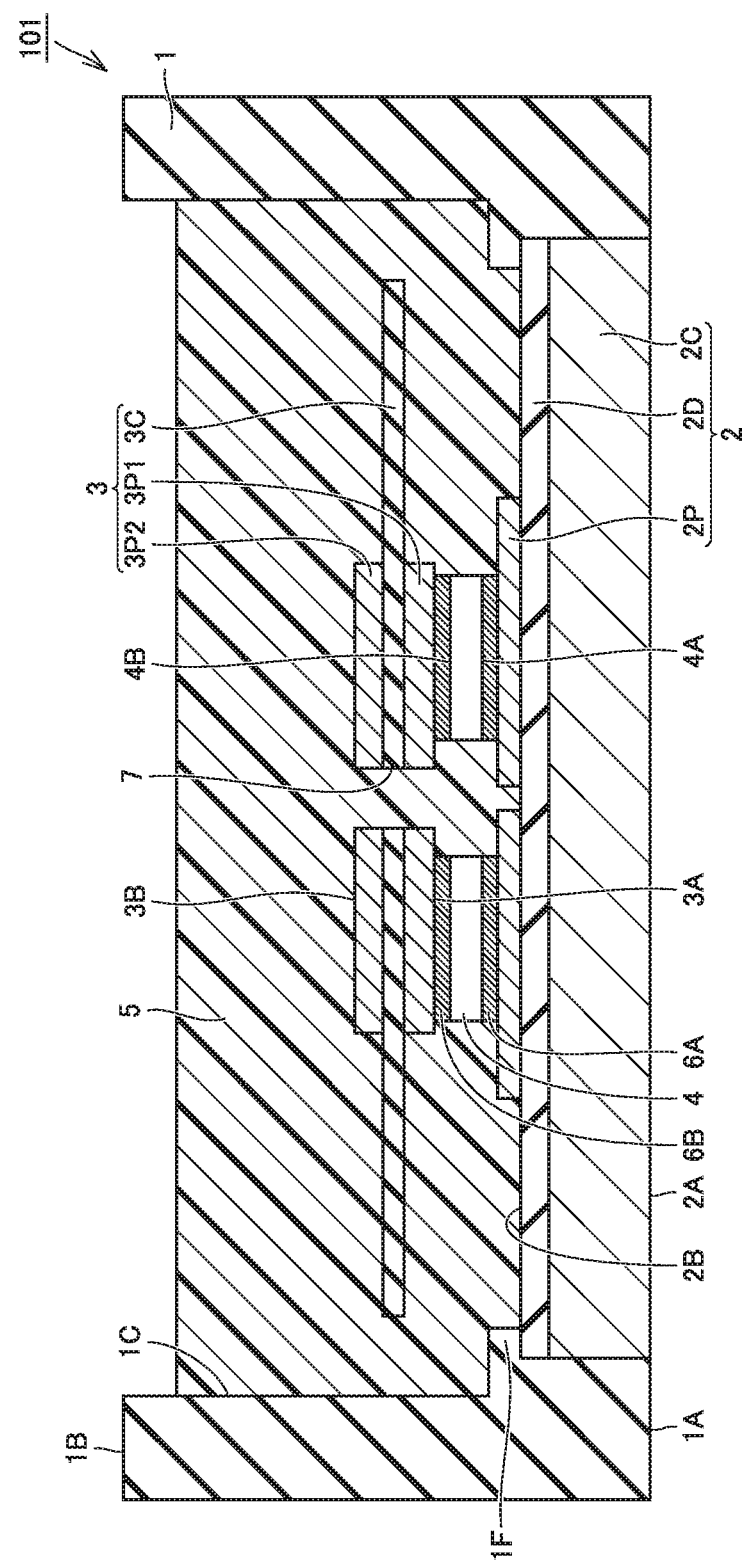
FIG. 3 is a schematic cross section of a configuration including a portion along a line C-C in FIG. 1, that is, a portion on a shorter side of the case of the power module of the first embodiment.

Initially a configuration of a power module as a power semiconductor device according to the present embodiment will be described with reference to FIGS. 1 to 4. With reference to FIGS. 1 to 4, a power module 101 of the present embodiment includes a case 1 as a casing, a lower insulating circuit board 2 as a first insulating circuit board, an upper insulating circuit board 3 as a second insulating circuit board, a semiconductor element 4, and a sealing material 5 introduced into case 1. FIGS. 2A and 2B show portions taken along lines A-A and B-B indicated in FIG. 1 and FIG. 3 shows a portion taken along a line C-C indicated in FIG. 1. Accordingly, in FIGS. 2A and 2B, a rightward/leftward direction corresponds to the direction of a shorter side of a rectangle in FIG. 1 (a vertical direction), and in FIG. 3, a rightward/leftward direction corresponds to the direction of a longer side of the rectangle in FIG. 1 (a rightward/leftward direction).

Case 1 is a member disposed to surround lower insulating circuit board 2, upper insulating circuit board 3, semiconductor element 4, and sealing material 5 in a plan view. If this is put in another way, lower insulating circuit board 2, upper insulating circuit board 3, and the like are disposed to be surrounded by case 1.

As shown in FIG. 1, case 1 is in the form of a rectangular frame for example. Case 1 is disposed at an outermost portion of power module 101 and thus in the form of a box surrounding power module 101 entirely. Case 1 is made of a mechanically significantly strong and significantly insulating material, such as generally known PPS (polyphenylene sulfide resin), liquid crystal polymer, or the like. PPS has a thermal conductivity of about 0.5 W/(m·K).

Case 1 has one main surface 1A configuring a lowermost portion in FIG. 2A and FIG. 2B and the other main surface 1B configuring an uppermost portion in FIGS. 2A and 2B, and therebetween the member of the above material extends in a vertical direction in FIGS. 2A and 2B to configure a body of case 1. Furthermore, case 1 that is in the form of a frame has an inner wall surface 1C as a surface facing a region surrounded by case 1. Furthermore, case 1 has an inner bottom surface 1D in a relatively lower region closer to one main surface 1A, in particular. Inner bottom surface 1D is an uppermost portion of that region of a lower portion of case 1 in which the body extends in the rightward/leftward direction in FIGS. 2A and 2B, i.e., along one main surface 1A, and it is formed as another main surface configuring a bottom surface in the surrounded region. One main surface 1A of case 1 at an outermost portion thereof in a plan view is opposite to the other main surface 1B and at a potion inner than the outermost portion is opposite to inner bottom surface 1D.

Furthermore, as will be described later, case 1 of the present embodiment is formed such that a protrusion 1E extends from at least a portion of an inner wall surface of case 1.

Lower insulating circuit board 2 is a member in the form of a flat plate forming a base of the entirety of power module 101. Lower insulating circuit board 2 has one main surface 2A as a main surface on a lower side in FIGS. 2A and 2B to 4 and the other main surface 2B opposite to one main surface 2A, i.e., as a main surface on an upper side in FIGS. 2A and 2B to 4, and, as shown in FIG. 1, it is a member in the form of a rectangular plane. In other words, one main surface 2A and the other main surface 2B of lower insulating circuit board 2 have a rectangular shape as shown in FIG. 1.

Lower insulating circuit board 2 is also a member for allowing heat generated by semiconductor element 4 to be dissipated below lower insulating circuit board 2 in FIGS. 2 to 4. Lower insulating circuit board 2 has a configuration in which an insulating sheet 2D is stacked on a metal base plate 2C and an upper surface pattern 2P is formed on a portion of insulating sheet 2D. Here, for example, a surface formed by connecting a lowermost portion of lower insulating circuit board 2 in FIGS. 2A and 2B is defined as one main surface 2A and a surface formed by connecting an uppermost portion of lower insulating circuit board 2 in FIGS. 2A and 2B is defined as the other main surface 2B. Therefore, the other main surface 2B serves as an uppermost surface of upper surface pattern 2P in a region in which upper surface pattern 2P is formed, and the other main surface 2B serves as an uppermost surface of insulating sheet 2D in a region in which upper surface pattern 2P is not formed.

Metal base plate 2C is a member for allowing heat generated when semiconductor element 4 is driven to be released outside power module 101, i.e., from one main surface 2A downward. Metal base plate 2C is preferably made of, for example, copper, aluminum, or the like, but it is not limited thereto as long as it is a metal material having a good heat dissipation property. From a viewpoint of weight reduction and workability, however, it is preferable that metal base plate 2C be made of aluminum.

Insulating sheet 2D is a member in the form of a flat plate provided to electrically insulate semiconductor element 4 and/or the like disposed thereon and lower insulating circuit board 2 from each other, i.e., to allow lower insulating circuit board 2 to entirely function as an insulating material. Insulating sheet 2D is preferably composed of a thermosetting resin such as epoxy resin. Insulating sheet 2D is disposed on an entire surface on metal base plate 2C, thereby electrically insulating upper surface pattern 2P and metal base plate 2C from each other.

Upper surface pattern 2P is a thin film of a metal such as copper formed on insulating sheet 2D made of resin, as shown. Upper surface pattern 2P is electrically connected to an external connection terminal or the like (not shown) disposed thereabove and is also electrically connected to semiconductor element 4.

In the above description, lower insulating circuit board 2 is configured such that upper surface pattern 2P can be electrically insulated from a lower region by insulating sheet 2D. However, lower insulating circuit board 2 is not limited as such, and may be a ceramic substrate, for example. Alternatively, lower insulating circuit board 2 may be configured such that an upper surface pattern made of metal or a patterned lead frame is formed on one main surface of an insulating substrate made of ceramic, for example.

Upper insulating circuit board 3 is disposed directly above lower insulating circuit board 2 with a spacing therebetween such that upper insulating circuit board 3 overlaps lower insulating circuit board 2 in a plan view. Upper insulating circuit board 3 has one main surface 3A as a main surface on a lower side in FIGS. 2A and 2B to 4 and the other main surface 3B opposite to one main surface 3A, i.e., as a main surface on an upper side in FIGS. 2A and 2B to 4, and, as shown in FIG. 1, it is a member in the form of a rectangular plane. In other words, one main surface 3A and the other main surface 3B of upper insulating circuit board 3 have a rectangular shape as shown in FIG. 1.

Upper insulating circuit board 3 has an insulating substrate 3C, a lower surface pattern 3P1 formed on a main surface of insulating substrate 3C that is closer a lower side in FIGS. 2A and 2B, and an upper surface pattern 3P2 formed on a main surface of insulating substrate 3C that is closer an upper side in FIGS. 2A and 2B. Here, for example, a surface formed by connecting a lowermost portion of upper insulating circuit board 3 in FIGS. 2A and 2B is defined as one main surface 3A and a surface formed by connecting an uppermost portion of upper insulating circuit board 3 in FIGS. 2A and 2B is defined as the other main surface 3B. Therefore, the other main surface 3B serves as an uppermost surface of upper surface pattern 3P2 in a region in which upper surface pattern 3P2 is formed, and the other main surface 3B serves as an uppermost surface of insulating substrate 3C in a region in which upper surface pattern 3P2 is not formed. It should be noted that how upper surface pattern 3P2 is arranged, such as the shape thereof and the number thereof, is shown in a simplified manner in FIG. 1 and it may actually be different from the manner shown in FIG. 1.

Figure 4:
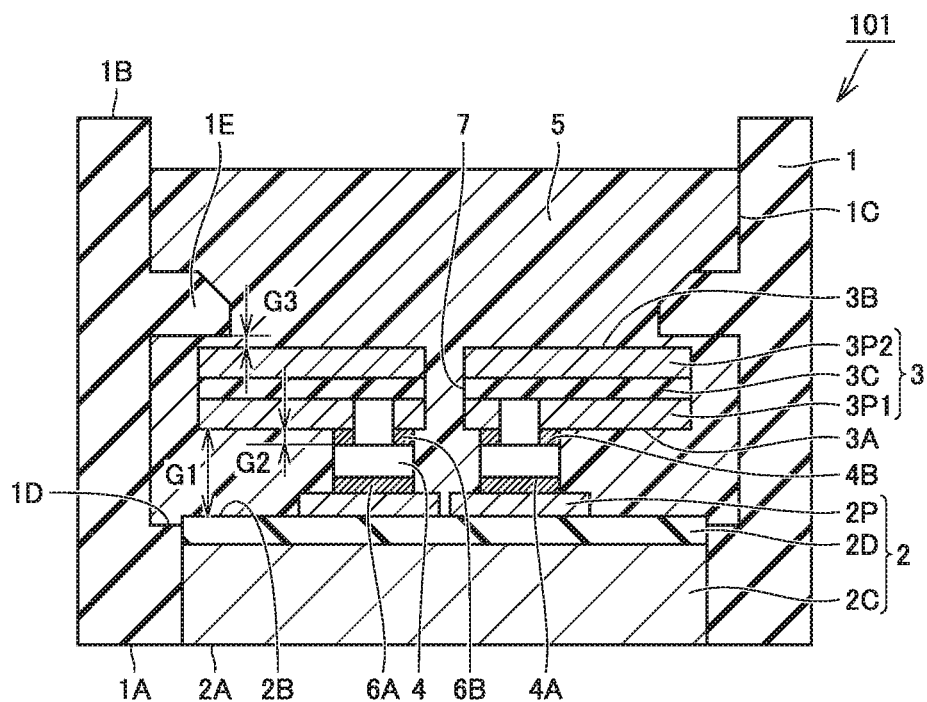
FIG. 4 is a schematic cross section defining a dimension of a gap of each portion of the power module of the first embodiment.

More specifically, as shown in FIG. 4, a spacing G1 from the other main surface 2B of lower insulating circuit board 2, which is herein on insulating sheet 2D, but may be on upper surface pattern 2P, to one main surface 3A of upper insulating circuit board 3, which is herein on lower surface pattern 3P1, but may be on insulating substrate 3C, is preferably about 1.0 mm (0.8 mm or more and 2.0 mm or less) for example. It is to be noted that spacing G1 is often set to 1.28 mm in practice. Further, lower surface pattern 3P1 and upper surface pattern 3P2 may be formed to be spaced from each other along the main surfaces of insulating substrate 3C. Further, it is preferable that a narrow spacing G2 between the other main surface 4B of semiconductor element 4 and one main surface 3A of upper insulating circuit board 3 thereon be for example about 0.5 mm (0.3 mm or more and 0.7 mm or less).

Insulating substrate 3C is a member in the form of a flat plate made of an insulating material such as a ceramic or resin material for example. Furthermore, lower surface pattern 3P1 and upper surface pattern 3P2 are each a thin film of a metal such as copper formed on insulating substrate 3C.

Semiconductor element 4 is a member with a power element such as an IGBT (Insulated Gate Bipolar Transistor), a MOSFET (Metal Oxide Semiconductor Field Effect Transistor) and an FWDi (Free Wheel Diode), for example mounted. Semiconductor element 4 is a chip-shaped member formed of, for example, a single crystal of silicon (Si) or silicon carbide (SiC) or the like. However, semiconductor element 4 is not limited as such, and may be formed of a so-called wide band gap semiconductor, such as gallium nitride (GaN) or diamond, having a band gap larger than that of silicon.

Semiconductor element 4 has one main surface 4A as a main surface on a lower side in FIGS. 2A and 2B to 4 and the other main surface 4B opposite to one main surface 4A, i.e., as a main surface on an upper side in FIGS. 2A and 2B to 4. Semiconductor element 4 is sandwiched and thus disposed between lower insulating circuit board 2 and upper insulating circuit board 3 disposed so as to overlap each other with a spacing therebetween in the vertical direction in FIGS. 2A and 2B. One main surface 4A of semiconductor element 4 is electrically connected to lower insulating circuit board 2 and the other main surface 4B of semiconductor element 4 is electrically connected to upper insulating circuit board 3. Specifically, one main surface 4A of semiconductor element 4 and upper surface pattern 2P of lower insulating circuit board 2 are electrically bonded to each other via a first bonding material 6A. Similarly, the other main surface 4B of semiconductor element 4 and lower surface pattern 3P1 of upper insulating circuit board 3 are electrically bonded to each other via a second bonding material 6B. It is preferable that first bonding material 6A and second bonding material 6B be made of, for example, a solder material for die bonding, but they are not limited thereto, and may be a bonding material containing sinterable silver particles or copper particles. Using a sinterable bonding material as first bonding material 6A and second bonding material 6B allows a longer lifetime than using the solder material. When semiconductor element 4 of silicon carbide allowing an operation at high temperature is used, then, from a viewpoint of taking advantage of its characteristics, the effect of using a sinterable bonding material as first bonding material 6A and second bonding material 6B to provide semiconductor element 4 with a longer lifetime can further be enhanced.

Lower insulating circuit board 2 is disposed at a lowermost portion of the region surrounded by case 1 and is bonded to case 1, whereby case 1 and lower insulating circuit board 2 form a member in the form of a container. Thus, lower insulating circuit board 2 has a surface with at least a portion bonded to a surface of case 1, whereby a member in the form of a container is configured as described above. The region surrounded by case 1 is filled with sealing material 5 so as to fill an interior of the member in the form of a container, i.e., a region in which upper insulating circuit board 3, semiconductor element 4 and the like are disposed. Sealing material 5 is a generally known gel or the like solidified, however, it may be epoxy resin in the form of liquid.

In power module 101, upper insulating circuit board 3 has an injection port 7 formed therethrough as a hole extending from one main surface 3A to reach the other main surface 3B opposite thereto. In FIGS. 1, and 2A and 2B, one injection hole 7 is provided at a center of upper insulating circuit board 3 in a plan view, and extends from one main surface 3A of lower surface pattern 3P1 to the other main surface 3B of upper surface pattern 3P2 and thus penetrates upper insulating circuit board 3 entirely in the direction of its thickness.

As shown in FIG. 1, injection port 7 is preferably, for example, circular in a plan view. This is because, as will be described later, when supplying sealing material 5 into case 1, a nozzle for injecting sealing material 5 is inserted into injection port 7, and injection port 7 that is circular in a plan view allows the nozzle to be easily inserted thereinto. Further, since the nozzle is inserted as described above, it is preferable that injection port 7 have a size larger than the diameter of the nozzle in a plan view. Furthermore, while it is preferable that basically, only one injection port 7 be formed at the center of upper insulating circuit board 3 in a plan view, as has been discussed above, a plurality of injection ports 7 may be formed such that they are spaced from one another. Furthermore, as will be described later, injection port 7 may be formed at a portion of upper insulating circuit board 3 other than the center thereof in the plan view.

Protrusion 1E of case 1 is formed on inner wall surface 1C of case 1 somewhat above the uppermost surface of upper insulating circuit board 3, i.e., the other main surface 3B, in particular. More specifically, as shown in FIG. 4, a spacing G3 from the other main surface 3B of upper insulating circuit board 3, which is herein on upper surface pattern 3P2 but may be on insulating substrate 3C, to a lowermost portion of protrusion 1E is preferably, for example, G2 or less. It should be noted that spacing G3 does not necessarily exist, and it may not exist at all. That is, the lowermost surface of protrusion 1E and a portion of a surface of upper insulating circuit board 3 may be in contact with each other.

Lower insulating circuit board 2 and upper insulating circuit board 3 are disposed in the region surrounded by case 1 such that normally lower and upper insulating circuit boards 2 and 3 are not in contact with inner wall surface 1C of case 1 and are spaced from inner wall surface 1C of case 1. However, protrusion 1E extends from inner wall surface 1C toward the region surrounded by case 1, i.e., toward a side where upper insulating circuit board 3 and the like are disposed. For this reason, protrusion 1E partially extends to a region overlapping lower insulating circuit board 2 or upper insulating circuit board 3 in a plan view. Therefore, as shown in FIG. 1, a portion of upper insulating circuit board 3 facing a longer side of case 1 in a plan view is covered with protrusion 1E when viewed from above and cannot be visually recognized.

As shown in FIG. 1 and FIGS. 2A and 2B, protrusion 1E preferably extends only from at least a portion of inner wall surface 1C on a longer side of case 1 in the form of a rectangle, i.e., having a longer side and a shorter side, in a plan view. As shown in FIGS. 1 and 3, protrusion 1E preferably does not extend from inner wall surface 1C on the shorter side of case 1 in the form of the rectangle in the plan view. Thus, as shown in FIG. 1, a portion of upper insulating circuit board 3 facing the shorter side of case 1 in the plan view is not covered with protrusion 1E when viewed from above and is thus entirely visible. As shown in FIG. 2A, in the present embodiment, protrusion 1E is formed with case 1 in one piece. That is, protrusion 1E is formed of a material identical to that of case 1. Protrusion 1E may extend from only a portion of inner wall surface 1C on the longer side of case 1 in the form of the rectangle, or may extend from the entirety thereof.

As shown in FIG. 3, a rested portion 1F extends from (at least a portion of) inner wall surface 1C on the longer side of case 1 toward the region surrounded by case 1. Rested portion 1F is formed below protrusion 1E in FIG. 3. Rested portion 1F is a portion rested on the other main surface 2B of lower insulating circuit board 2 in contact with a portion (e.g., an outermost portion) of the other main surface 2B in a plan view. Note that rested portion 1F overlaps lower insulating circuit board 2 in a plan view at an outermost portion which is in contact with the other main surface 2B of lower insulating circuit board 2, and rested portion 1F also extends to a region overlapping upper insulating circuit board 3 in a plan view. While basically, rested portion 1F is formed with case 1 in one piece, it is not limited as such, and it may be formed to be distinct from case 1.

In addition, power module 101 further includes an external output terminal 8. External output terminal 8 is a member for enabling electrical connection between an interior of power module 101 and an exterior thereof. That is, external output terminal 8 allows an electrical signal to be input to and output from semiconductor element 4 disposed in power module 101. Accordingly, as shown in FIG. 2B, external output terminal 8 is bonded to upper surface pattern 3P2 of upper insulating circuit board 3 with a third bonding material 6C such as a solder material similar to first bonding material 6A and second bonding material 6B.

As shown in FIGS. 1 and 2, it is preferable that external output terminal 8 be disposed adjacent to protrusion 1E. That is, as well as protrusion 1E, external output terminal 8 is disposed adjacent to protrusion 1E disposed at a portion on the longer side of case 1 in a plan view, at that portion, with respect to the direction of the longer side. A plurality of external output terminals 8 may be disposed such that they are spaced from one another in the direction of the longer side of case 1. In FIG. 1, two or three external output terminals 8 are disposed adjacent to on another in the direction of the longer side.

As shown in FIG. 2B, external output terminal 8 includes a vertically extending portion 8A extending in a vertical direction in FIG. 2B in which case 1 extends, a horizontally extending portion 8B extending in a rightward/leftward direction in FIG. 2B such as along one main surface 3A of upper insulating circuit board 3, and a bent portion 8C bending external output terminal 8 at a portion therebetween. Vertically extending portion 8A has a major portion thereof buried in the body of case 1, and has only an uppermost end portion thereof exposed from case 1. Vertically extending portion 8A exposed from case 1 can be electrically connected to an exterior of power module 101. Horizontally extending portion 8B has only a portion relatively close to bent portion 8C buried in the body of case 1, and has a remainder with a major portion exposed therefrom and disposed in the region surrounded by case 1. And the major portion of the remainder extends in the same direction as protrusion 1E, and is electrically connected to, for example, a portion (or upper surface pattern 3P2) of upper insulating circuit board 3. As shown in FIG. 2B, horizontally extending portion 8B of external output terminal 8 and upper surface pattern 3P2 of upper insulating circuit board 3 are bonded together by, for example, third bonding material 6C. As well as first bonding material 6A and second bonding material 6B, third bonding material 6C is preferably composed of, for example, a solder material for die bonding, but it is not limited thereto, and it may be a bonding material including sinterable silver particles or copper particles.

Reference will now be made to FIGS. 5 to 7A and 7B to briefly describe a method of manufacturing power module 101 of the present embodiment.

Figure 5:
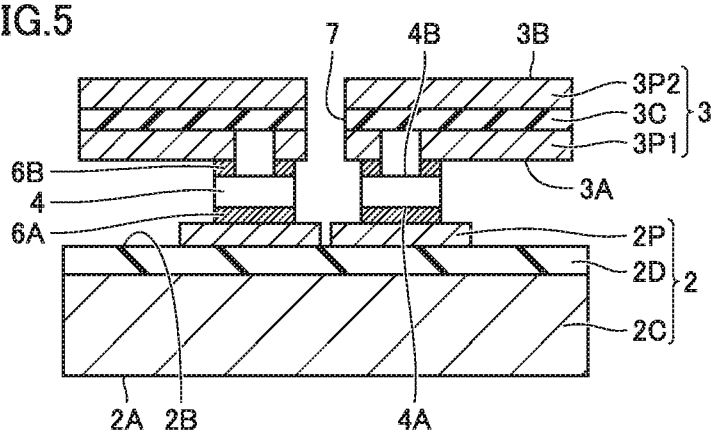
FIG. 5 is a schematic cross section for illustrating a first step of a method of manufacturing the power module according to the first embodiment.

Referring to FIG. 5, lower insulating circuit board 2, upper insulating circuit board 3 and semiconductor element 4 are initially prepared. Upper surface pattern 2P of lower insulating circuit board 2, lower surface pattern 3P1 of upper insulating circuit board 3 and the like are for example formed as follows: on the other main surface 2B of insulating sheet 2D and on one main surface 3A of insulating substrate 3C a generally known printing method or the like is used such that a metal layer is formed thereon for example by press-working and subsequently the metal layer is patterned into a desired planar shape by a generally known photolithography technique or the like. It should be noted, however, that upper surface pattern 2P, lower surface pattern 3P1, and the like may be formed such that a metal member previously patterned into a desired planar shape and thickness is subsequently press-worked and thus formed on the other main surface 2B of insulating sheet 2D, one main surface 3A of insulating substrate 3C, and the like.

Lower insulating circuit board 2 or upper insulating circuit board 3 is provided with injection port 7 as a hole extending from one main surface to the opposite, other main surface. Herein, one injection port 7 is formed through upper insulating circuit board 3 at a center thereof in a plan view.

Subsequently, upper insulating circuit board 3 is joined over one main surface 2A of lower insulating circuit board 2 so as to sandwich semiconductor element 4 therebetween. Specifically, for example, one main surface 4A of semiconductor element 4 is bonded to the uppermost surface of lower insulating circuit board 2, or upper surface pattern 2P, via first bonding material 6A. Further, the other main surface 4B of semiconductor element 4 is bonded to the lowermost surface of upper insulating circuit board 3, or lower surface pattern 3P1, via second bonding material 6B.

Figure 6:
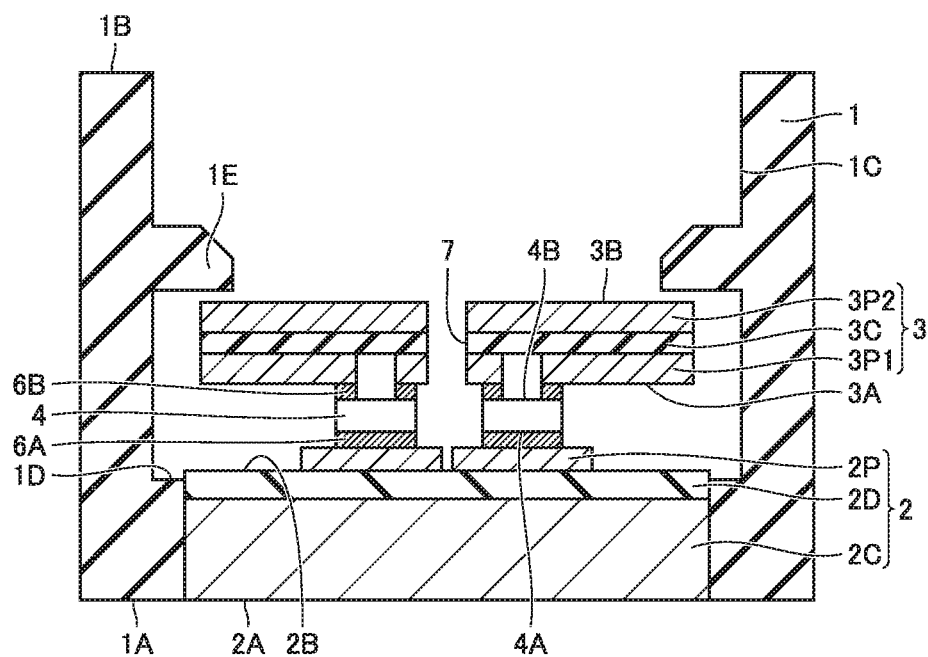
FIG. 6 is a schematic cross section for illustrating a second step of the method of manufacturing the power module according to the first embodiment.

Referring to FIG. 6, a set of lower insulating circuit board 2, upper insulating circuit board 3 and semiconductor element 4 stacked together in the process of FIG. 5 is accommodated within the frame of case 1 so as to be surrounded by case 1. Specifically, it is particularly preferable that a relatively lower region of case 1 be in contact with a portion of a surface of lower insulating circuit board 2, i.e., an end surface thereof, and a region of a portion of the other main surface 2B adjacent thereto, and the set be fitted in case 1. Thus when a portion of a surface of case 1 and a portion of a surface of lower insulating circuit board 2 come into contact with each other without a gap, the portions form a member in the form of a container, and sealing material 5 or the like can be supplied into the member in the form of a container.

Figure 7A:
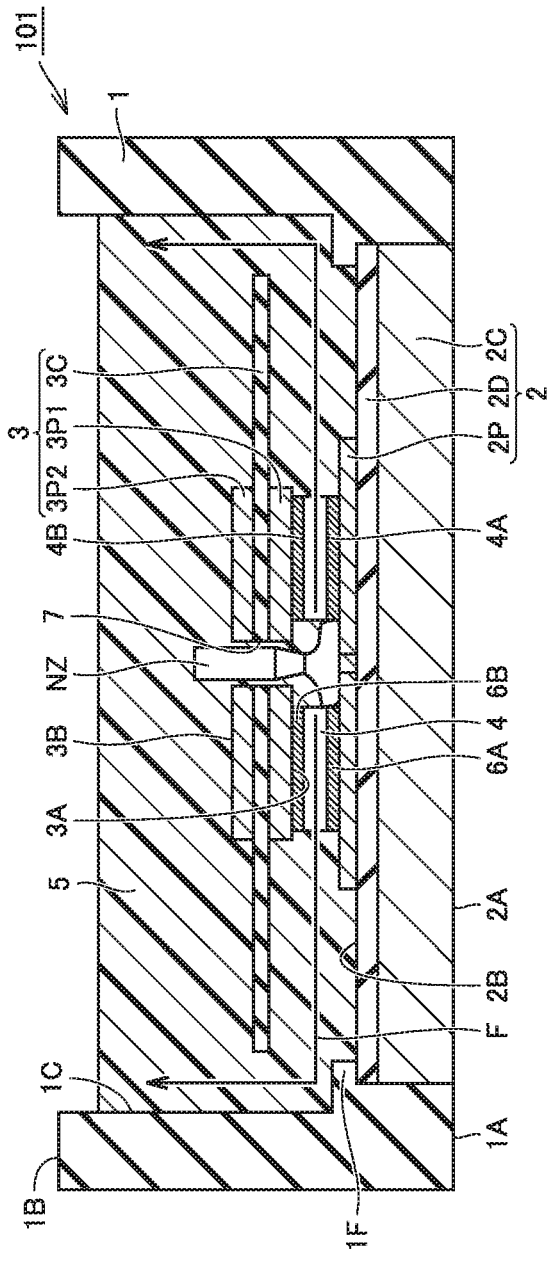
FIGS. 7A and 7B show a third step of the method of manufacturing the power module according to the first embodiment in a schematic cross section taken along line C-C in FIG. 1 and a schematic cross section taken along line A-A in FIG. 1, respectively.
Figure 7B:
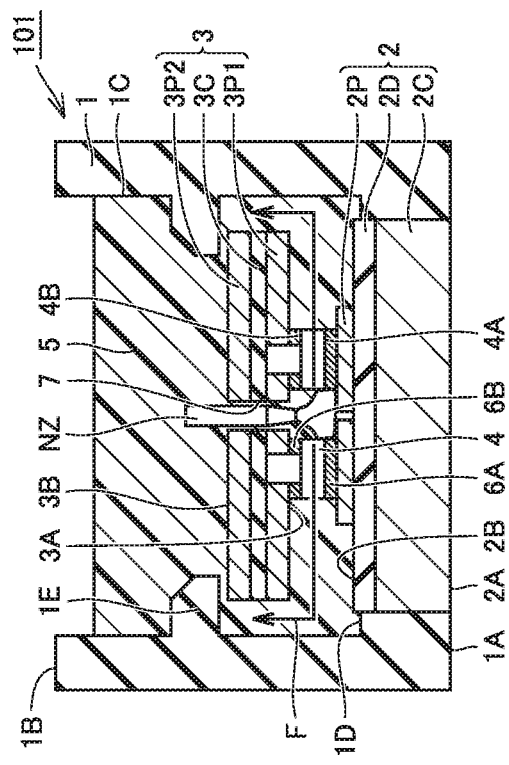

With reference to FIGS. 7A and 7B, by supplying sealing material 5 into a region inside the member in the form of a container that is surrounded by case 1 in the step of FIG. 6, lower insulating circuit board 2, upper insulating circuit board 3 and semiconductor element 4 in case 1 are each sealed. More specifically, referring to FIGS. 7A and 7B, for example, a nozzle NZ for supplying sealing material 5 is inserted into injection port 7 formed in upper insulating circuit board 3, and from a tip of nozzle NZ, for example, sealing material 5 in the form of a gel is injected. Since nozzle NZ is inserted so that the tip faces downward, sealing material 5 injected flows below nozzle NZ and then on a region on the other main surface 2B of lower insulating circuit board 2, and subsequently flows toward a region on the other main surface 3B of upper insulating circuit board 3 as shown by a flow F indicated by an arrow in the figure. Through the injection molding process described above, sealing material 5 is disposed so as to fill the entire region in case 1. Sealing material 5 filling the interior of the member in the form of a container formed by case 1 and lower insulating circuit board 2 is solidified and thus disposed as a solid member.

Note that as has been described above, from at least a portion of inner wall surface 1C of case 1, protrusion 1E extending toward the region surrounded by the case is formed to reach a region overlapping upper insulating circuit board 3 in a plan view. Herein, protrusion 1E is formed with case 1 in one piece.

A function and effect of the present embodiment will now be described with reference to a comparative example in FIGS. 8, 9A and 9B, and FIGS. 10A and 10B.

Figure 8:
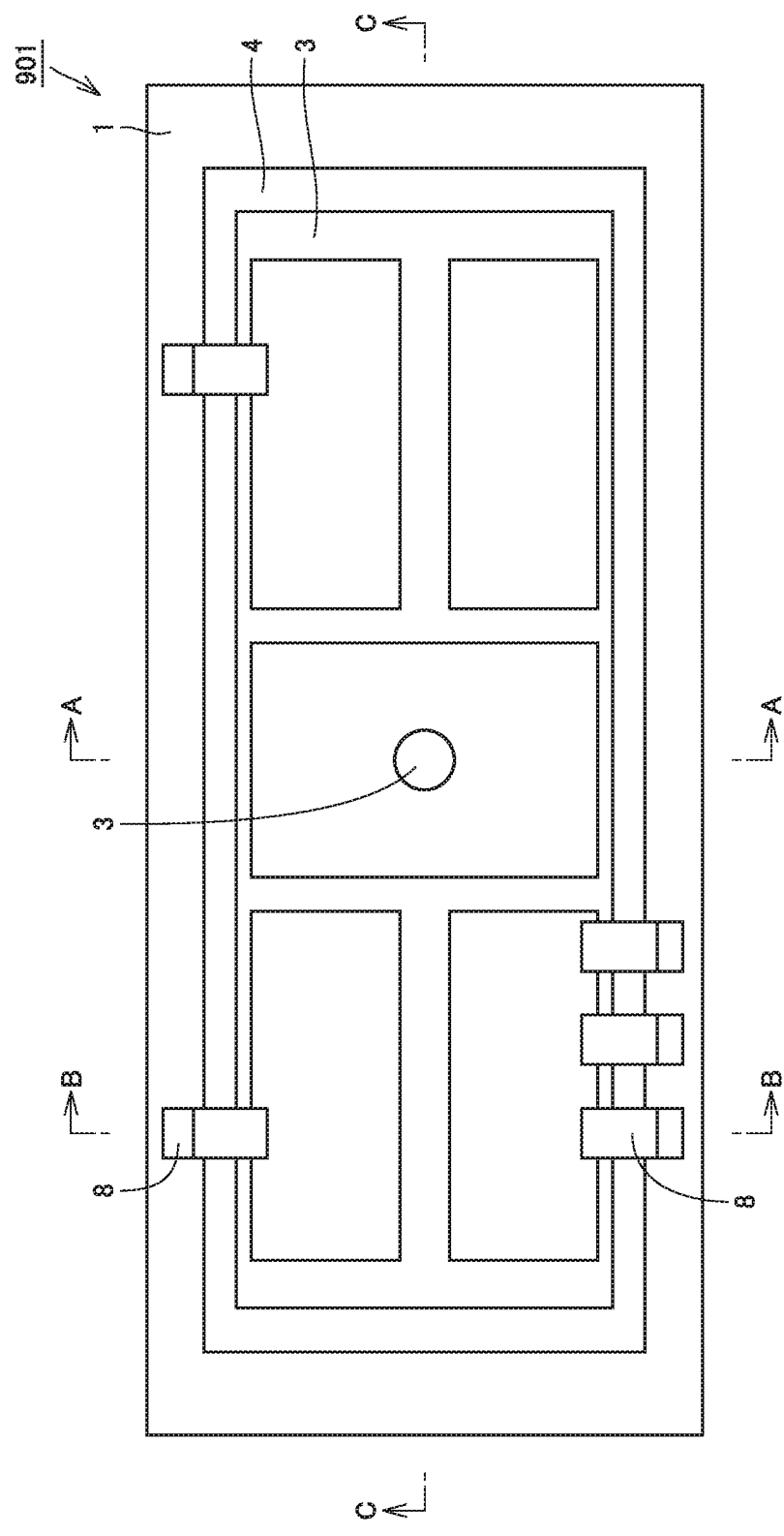
FIG. 8 is a schematic plan view of a configuration of a power module according to a comparative example.
Figure 9A:
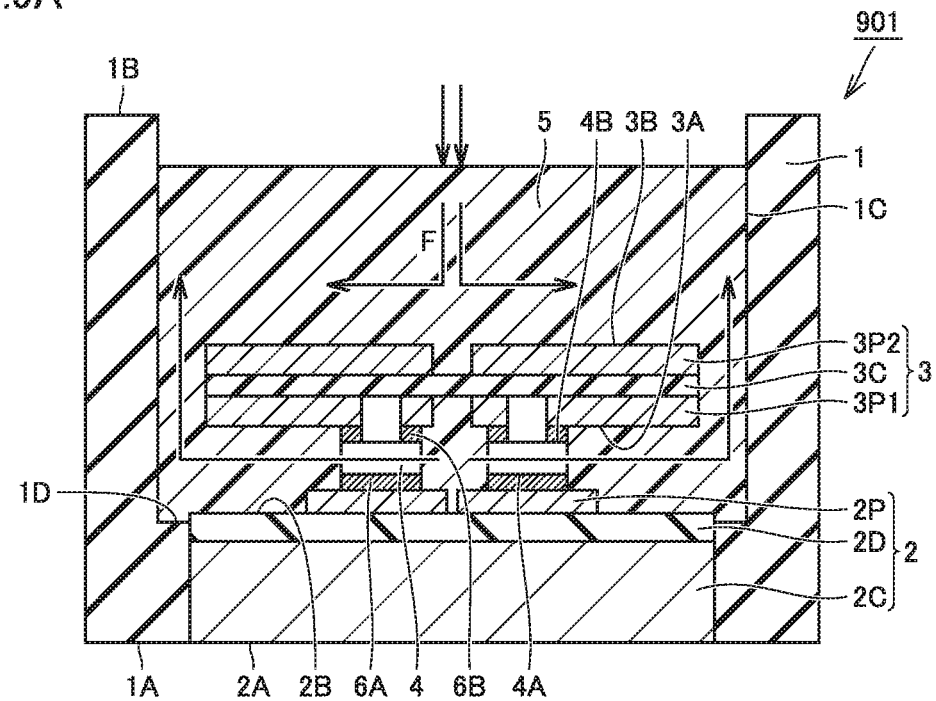
FIGS. 9A and 9B show a flow of a sealing material in a method of manufacturing the power module according to the comparative example at a sealing step similar to that of FIGS. 7A and 7B in a schematic cross section seen in a cross section taken along line A-A in FIG. 1 including a portion on a longer side of the case and a schematic cross section seen in a cross section taken along line B-B in FIG. 1 including a portion on the longer side of the case, respectively.
Figure 9B:
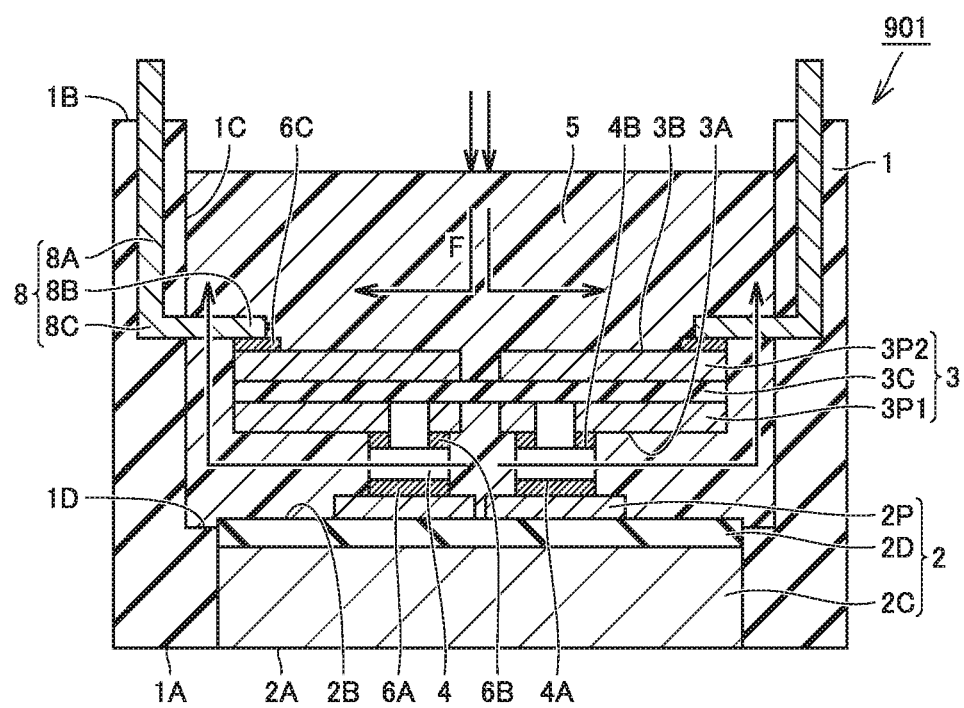

With reference to FIG. 8 and FIGS. 9A and 9B, a power module 901 of the comparative example also basically has a configuration similar to that of power module 101 of the present embodiment, and accordingly identical components are identically denoted and will not be described repeatedly. Note, however, that power module 901 does not have injection port 7 of upper insulating circuit board 3 and protrusion 1E extending from inner wall surface 1C of case 1 as provided in power module 101 of the present embodiment. In this respect, power module 901 is different in configuration from power module 101.

As shown in FIGS. 9A and 9B, in a process for forming power module 901 when sealing material 5 is supplied, as indicated by an arrow F in the figures, sealing material 5 is supplied from above upper insulating circuit board 3 into the member in the form of a container formed of case 1 and lower insulating circuit board 2. However, upper insulating circuit board 3 prevents sealing material 5 from flowing into a region below upper insulating circuit board 3, a region sandwiched between upper insulating circuit board 3 and lower insulating circuit board 2 in particular. Furthermore, sealing material 5 having flowed into the region sandwiched between upper insulating circuit board 3 and lower insulating circuit board 2 easily flows through a gap between upper insulating circuit board 3 and inner wall surface 1C of case 1 to a region above upper insulating circuit board 3. This is because protrusion 1E interrupting the outflow is not formed above upper insulating circuit board 3.

Therefore, it is less likely that the region sandwiched between upper insulating circuit board 3 and lower insulating circuit board 2 is in a manner in which the region is completely filled with sealing material 5, and a gap in which sealing material 5 is absent is partially formed in the region easily. If a region which is partially not filled with sealing material 5 is formed, an operational trouble may occur such as discharge therefrom of power supplied to power module 101. Therefore, it is preferable to avoid a state in which the region is partially not filled with sealing material 5.

Accordingly, power module 101 of the present embodiment is provided with injection port 7 as a hole in upper insulating circuit board 3, as described above, and sealing material 5 is supplied therethrough. Therefore, as shown in FIGS. 10A and 10B, a narrow region sandwiched between upper insulating circuit board 3 and lower insulating circuit board 2 can also be easily supplied with a sufficient amount of sealing material 5 and hence filled therewith densely.

Furthermore, in power module 101, protrusion 1E formed at a portion of inner wall surface 1C of case 1 can prevent sealing material 5 from easily flowing to a region above upper insulating circuit board 3 from the narrow region sandwiched between upper insulating circuit board 3 and lower insulating circuit board 2. This can maintain a sufficient amount of sealing material 5 in the narrow region sandwiched between upper insulating circuit board 3 and lower insulating circuit board 2.

Note, however, that while protrusion 1E and upper insulating circuit board 3 may be in contact with each other, they normally have a narrow gap of about 0.4 mm or less which is indicated by spacing G3 in FIG. 4. This is because although it is necessary to suppress outflow of sealing material 5 upward from protrusion 1E, it is also necessary to finally supply a region above upper insulating circuit board 3 with sealing material 5. The gap allows the region above upper insulating circuit board 3 to be also finally supplied with sealing material 5. Note that, as shown in FIGS. 2A and 2B and the like, protrusion 1E has a planar shape close to a trapezoidal shape with an upper edge notched. Such a shape allows sealing material 5 finally supplied to the region above upper insulating circuit board 3 to flow more smoothly and can thus alleviate a stress applied as sealing material 5 flows to the portion of interest.

To summarize the above, protrusion 1E preferably has an effect to be able to control sealing material 5 to prevent sealing material 5 from excessively flowing out above upper insulating circuit board 3 and allow sealing material 5 to flow out upward by a necessary minimum amount. From the viewpoint of achieving this effect, it is preferable that spacing G3 between protrusion 1E and upper insulating circuit board 3 be smaller than spacings G1 and G2 shown in FIG. 4, for example. For example, if spacing G3 is larger than spacing G2 (a gap between semiconductor element 4 and upper insulating circuit board 3), sealing material 5 easily flows upward from protrusion 1E excessively. However, spacing G3 smaller than spacing G2 increases to some extent an effect of suppressing a flow of sealing material 5 through spacing G3.

Further, protrusion 1E extends from only at least a portion of inner wall surface 1C on the longer side of case 1, and does not extend from inner wall surface 1C on the shorter side of case 1. That is, on the shorter side, a wide gap is formed between inner wall surface 1C of case 1 and upper insulating circuit board 3. Therefore, from the shorter side, sealing material 5 easily flows out above upper insulating circuit board 3 from the region between lower insulating circuit board 2 and upper insulating circuit board 3. This also allows sealing material 5 to appropriately flow out above upper insulating circuit board 3.

Protrusion 1E which extends only from inner wall surface 1C on the longer side of case 1 and does not extend from inner wall surface 1C on the shorter side of case 1 is more preferable than protrusion 1E which extends only from inner wall surface 1C on the shorter side of case 1 and does not extend from inner wall surface 1C on the longer side of case 1 for the following reason: As shown in FIGS. 7A and 7B, from injection port 7 formed at the center of upper insulating circuit board 3 (case 1) in a plan view, sealing material 5 is supplied through nozzle NZ such that sealing material 5 spreads in ripples. Accordingly, sealing material 5 supplied reaches inner wall surface 1C on the longer side of case 1 faster than inner wall surface 1C on the shorter side of case 1. This is because injection port 7 is less distant to inner wall surface 1C on the longer side of case 1 than inner wall surface 1C on the shorter side of case 1. Accordingly, sealing material 5 climbs upward along inner wall surface 1C on the longer side of case 1 more easily than inner wall surface 1C on the shorter side of case 1. Note that injection port 7 formed at the center of upper insulating circuit board 3 allows sealing material 5 to be diffused in ripples so as to therefrom reach inner wall surface 1C of a pair of longer sides substantially symmetrically and substantially concurrently.

Accordingly, it is preferable that protrusion 1E be provided on inner wall surface 1C on the longer side of case 1. In this way, sealing material 5 prevented by protrusion 1E from climbing up inner wall surface 1C on the longer side of case 1, as shown in FIG. 7B, flows in a region below upper insulating circuit board 3 toward inner wall surface 1C on the shorter side of case 1, as shown in FIG. 7A. Sealing material 5 can thus be supplied to a region between upper insulating circuit board 3 and lower insulating circuit board 2 without a gap.

Furthermore, as power module 101 has external output terminal 8 partially buried in case 1, it can be firmly fixed to power module 101 without peeling off case 1. Furthermore, as case 1 is arranged adjacent to protrusion 1E, its layout efficiency can be enhanced.

In the present embodiment, protrusion 1E is formed with case 1 in one piece, which allows a reduced number of manufacturing steps and hence a simplified process.

Second Embodiment

Figure 11:
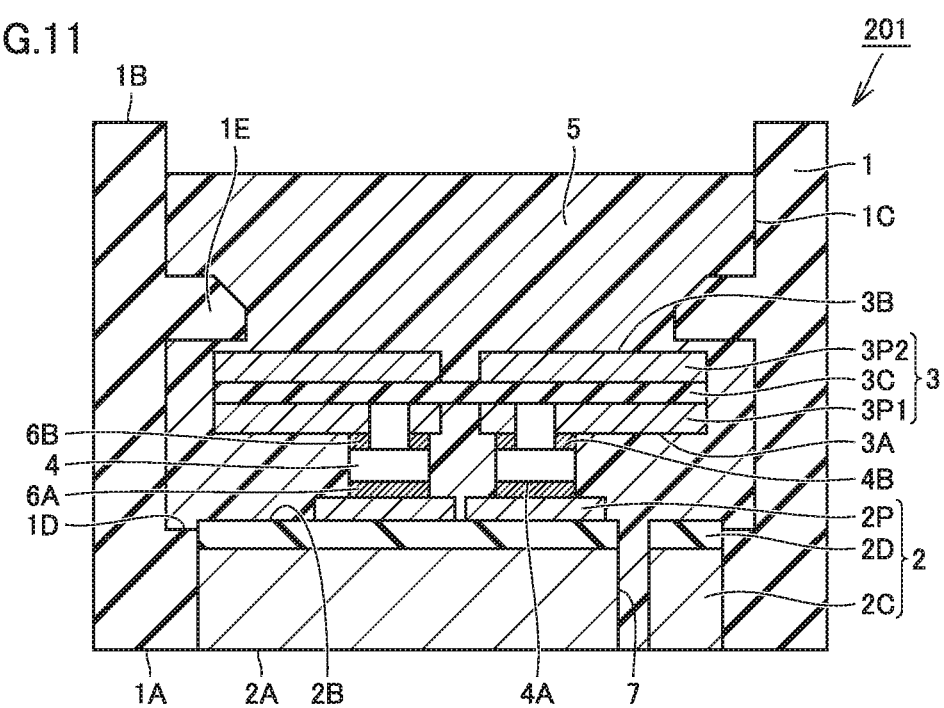
FIG. 11 is a schematic cross section of a configuration including a portion corresponding to a portion on a longer side of a case of a power module of a second embodiment taken along line A-A in FIG. 1.

With reference to FIG. 11, a power module 201 of the present embodiment basically has a configuration similar to that of power module 101 of the first embodiment, and accordingly identical components are identically denoted and will not be described repeatedly. Note that in power module 201, lower insulating circuit board 2, rather than upper insulating circuit board 3, has injection port 7 formed therethrough as a hole extending from one main surface 2A to reach the other main surface 2B opposite thereto. Note that in FIG. 11, upper surface pattern 2P is formed at a center of lower insulating circuit board 2 in a plan view, and accordingly, injection port 7 is formed in a region away from the center of lower insulating circuit board 2 in the plan view, that is, rightwardly of the center of FIG. 11. If possible, however, as in the case where injection port 7 is formed at the center of upper insulating circuit board 3 in power module 101 of the first embodiment, it is more preferable that the present embodiment also have injection port 7 at the center of lower insulating circuit board 2. In this way, as well as in the first embodiment, sealing material 5 spreading therefrom in ripples can reach inner wall surface 1C on the longer side of case 1 first.

In the present embodiment, a nozzle for supplying sealing material 5 is inserted into injection port 7 such that the nozzle has a tip facing upward, and sealing material 5 is injected from the tip. Thus, similarly as shown in FIG. 7A, sealing material 5 injected flows below nozzle NZ and then through a region on the other main surface 2B of lower insulating circuit board 2, and subsequently flows toward a region on the other main surface 3B of upper insulating circuit board 3 as shown by flow F indicated by an arrow in the figure.

Thus, injection port 7 is not limited such that it is formed through upper insulating circuit board 3, and may be formed through lower insulating circuit board 2.

For the remainder, the present embodiment is basically similar to the first embodiment, and accordingly it will not be described repeatedly in detail.

Third Embodiment

Figure 12:
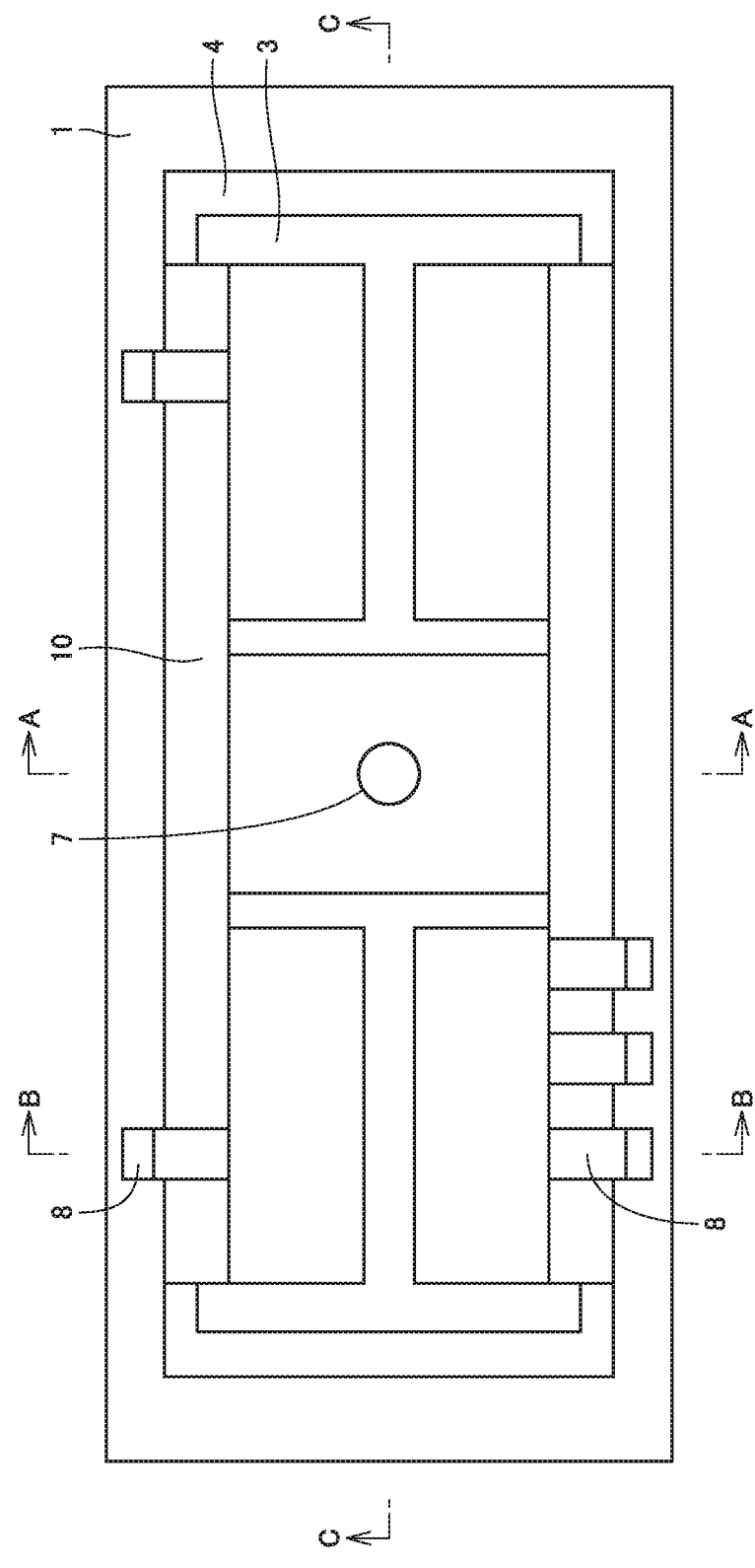
FIG. 12 is a schematic plan view of a configuration of a power module according to a third embodiment.
Figure 13:
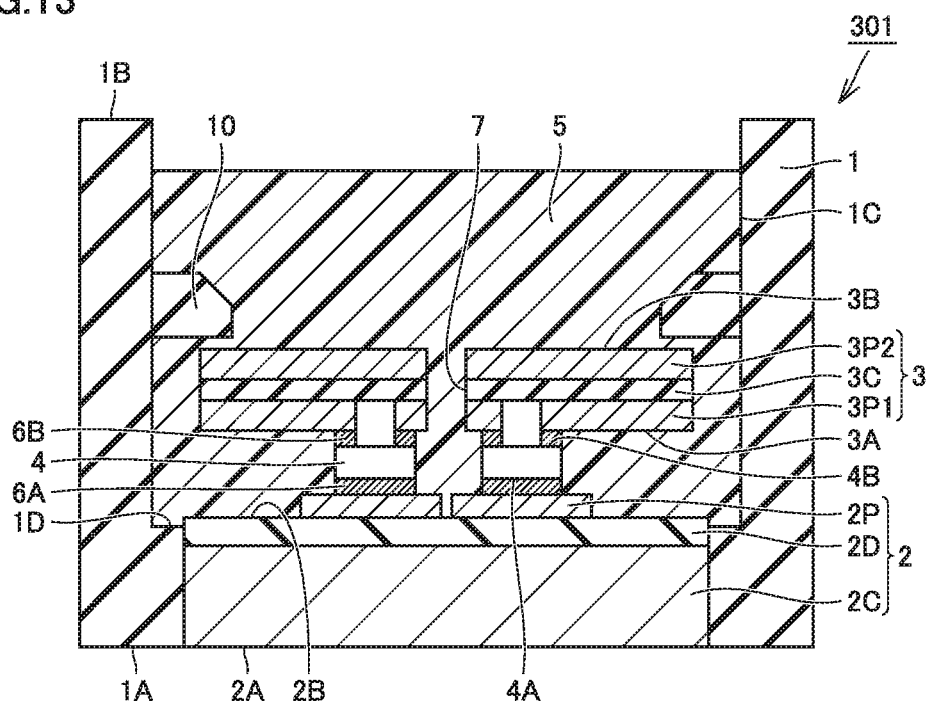
FIG. 13 is a schematic cross section of a configuration including a portion corresponding to a portion on a longer side of a case of a power module of the third embodiment in a first example taken along line A-A in FIG. 1.
Figure 14:
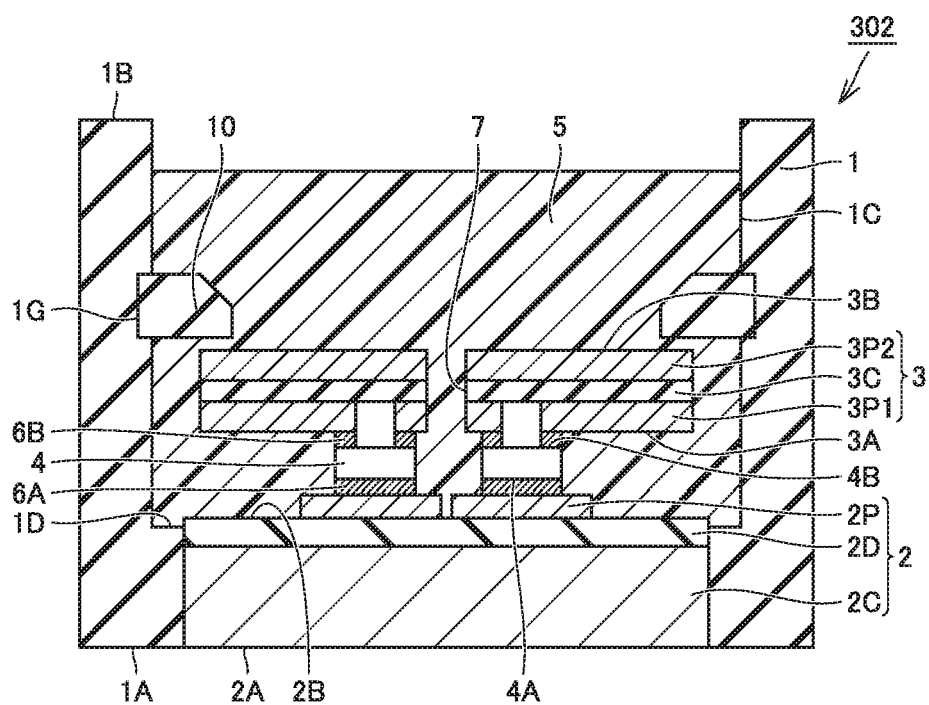
FIG. 14 is a schematic cross section of a configuration including a portion corresponding to a portion on a longer side of a case of a power module of the third embodiment in a second example taken along line A-A in FIG. 1.

With reference to FIGS. 12, 13 and 14, a power module of the present embodiment basically has a configuration similar to that of power module 101 of the first embodiment, and accordingly identical components are identically denoted and will not be described repeatedly. Note, however, that in the present embodiment, a protrusion 10 corresponding to protrusion 1E of the first embodiment is provided on inner wall surface 1C of case 1 as a member distinct from case 1.

More specifically, a power module 301 of a first example of the present embodiment shown in FIG. 13 has protrusion 10 bonded to a surface of inner wall surface 1C of case 1. Furthermore with reference to FIG. 14, a power module 302 of a second example of the present embodiment has a recess 1G formed at a portion of inner wall surface 1C of case 1, and protrusion 10 is fitted in recess 1G. Note, however, that protrusion 10 is similar to protrusion 1E of the first embodiment in a direction in which the former extends, shape and others, and accordingly, it will not be described repeatedly in detail.

In the present embodiment, as has been described above, protrusion 10 is provided on inner wall surface 1C of case 1 as a member distinct from case 1. Accordingly, in the manufacturing process, protrusion 10 can be attached subsequently after case 1, and lower insulating circuit board 2 and upper insulating circuit board 3 stacked in layers to form a set are bonded together and thus form the member in the form of a container. This allows more precise control to be done to allow spacing G3 (see FIG. 4) between upper insulating circuit board 3 and protrusion 10 thereabove to have a desired value than the first embodiment or the like. Note that, as well as protrusion 1E, protrusion 10 is also made of a mechanically significantly strong and significantly insulating material, such as generally known PPS, liquid crystal polymer, or the like.

For the remainder, the present embodiment is basically similar to the first embodiment, and accordingly it will not be described repeatedly in detail.

Fourth Embodiment

With reference to FIGS. 15, 16, 17 and 18, a power module of the present embodiment basically has a configuration similar to that of power module 101 of the first embodiment, and accordingly identical components are identically denoted and will not be described repeatedly. In the present embodiment, however, upper insulating circuit board 3 and a portion of case 1 are fixed to each other with an adhesive.

Figure 16:
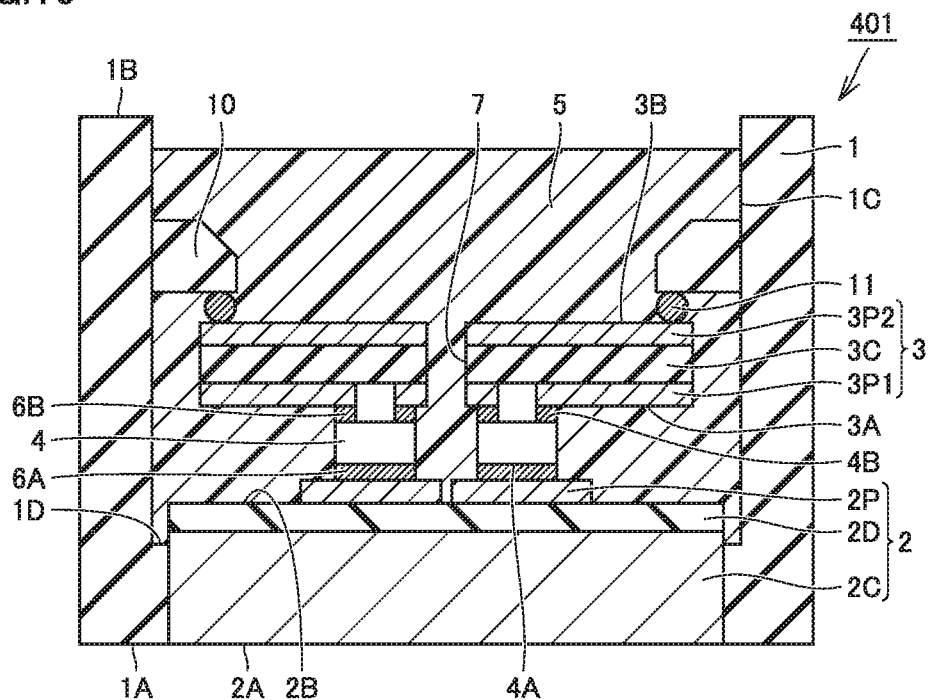
FIG. 16 is a schematic cross section of a configuration including a portion corresponding to a portion on a longer side of a case of a power module of the fourth embodiment in a first example taken along line A-A in FIG. 1.

More specifically, in a power module 401 of a first example of the present embodiment shown in FIG. 16, upper insulating circuit board 3 and protrusion 10 thereabove are fixed such that they are bonded together with an adhesive 11. That is, a region of a portion of an outermost portion of the other main surface 3B of upper insulating circuit board 3 in a plan view in particular, and a portion of a lowermost surface of protrusion 10 disposed so as to exactly overlap the region from above, are fixed to each other with adhesive 11. In contrast, in a power module 402 of a second example of the present embodiment shown in FIG. 17, upper insulating circuit board 3 and rested portion 1F therebelow are fixed such that they are bonded together with adhesive 11. Furthermore, in a power module 403 of a third example of the present embodiment shown in FIG. 18, adhesive 11 is disposed at both the position shown in FIG. 16 and the position shown in FIG. 17, and upper insulating circuit board 3 is fixed such that upper insulating circuit board 3, and both protrusion 10 and rested portion 1F are bonded together with adhesive 11.

While FIGS. 15 to 18 show protrusion 10 formed to be distinct from case 1, this is not exclusive, and in each example of the present embodiment, protrusion 1E formed with case 1 in one piece may be used.

Figure 17:
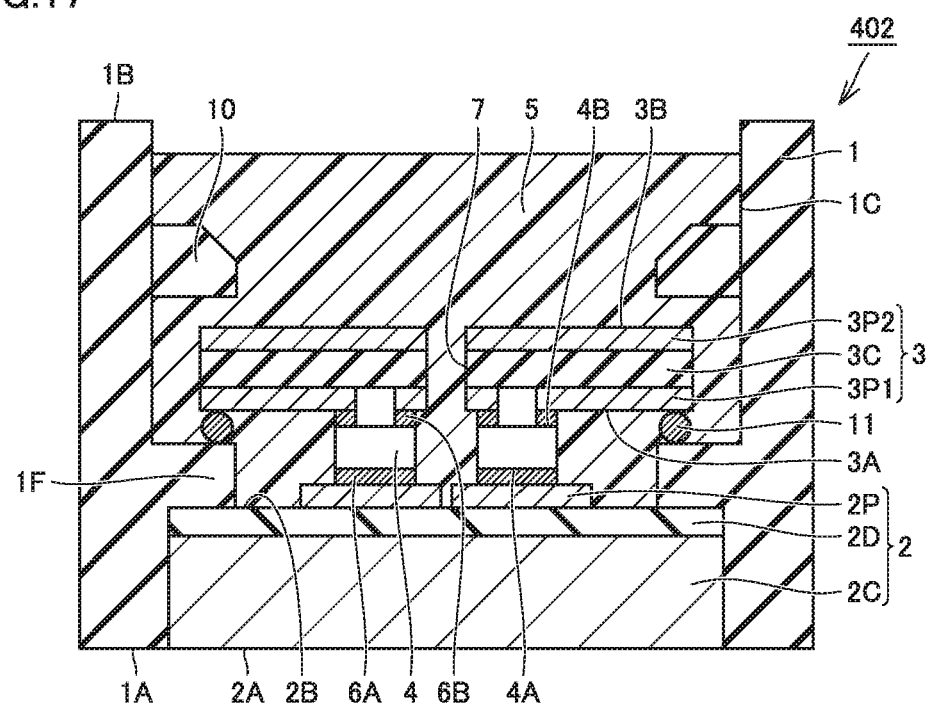
FIG. 17 is a schematic cross section of a configuration including a portion corresponding to a portion on a longer side of a case of a power module of the fourth embodiment in a second example taken along line A-A in FIG. 1.
Figure 18:
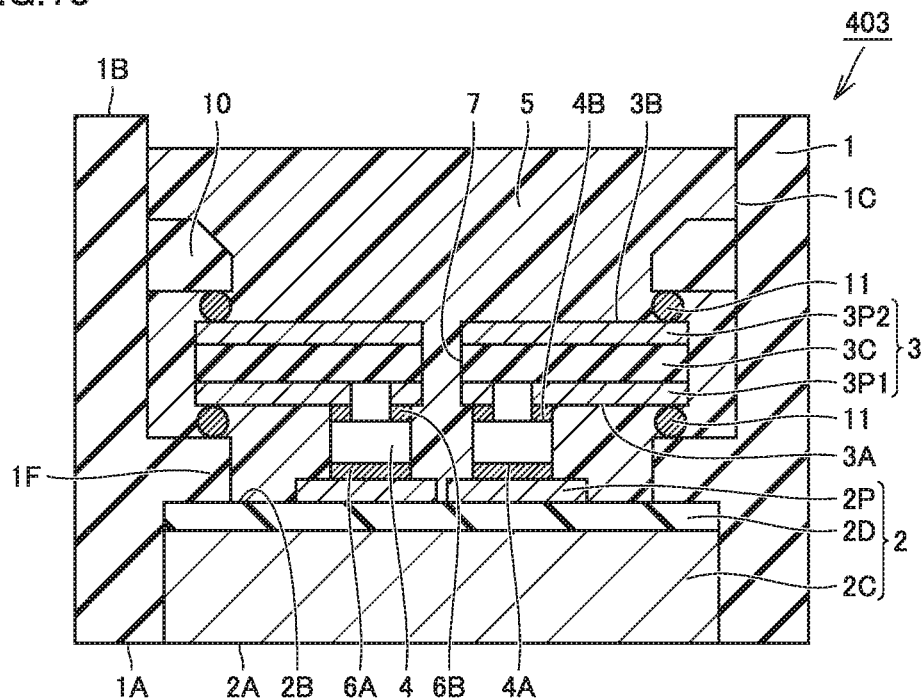
FIG. 18 is a schematic cross section of a configuration including a portion corresponding to a portion on a longer side of a case of a power module of the fourth embodiment in a third example taken along line A-A in FIG. 1.

In the present embodiment, as shown in FIGS. 16 and 18, upper insulating circuit board 3 and protrusion 1E, 10 are fixed to each other with adhesive 11. This allows more precise control to be done to allow spacing G3 (see FIG. 4) between upper insulating circuit board 3 and protrusion 1E, 10 thereabove to have a desired value. Similarly, in the present embodiment, as shown in FIGS. 17 and 18, upper insulating circuit board 3 and rested portion 1F are fixed to each other with adhesive 11. This allows more precise control to be done to allow a spacing between upper insulating circuit board 3 and rested portion 1F therebelow to have a desired value. Basically, the example in which protrusion 10 is fitted into recess 1G, as shown in FIG. 14, and the example in which protrusion 10 is bonded to inner wall surface 1C, as shown in FIG. 16, have equivalent effects in controlling the bonding position.

Bonding and thus fixing upper insulating circuit board 3 and protrusion 10 and the like together with adhesive 11 allows stronger bonding and fixing and more stable positional precision for example than bonding and fixing by third bonding material 6C bonding upper insulating circuit board 3 and external output terminal 8 together.

Figure 15:
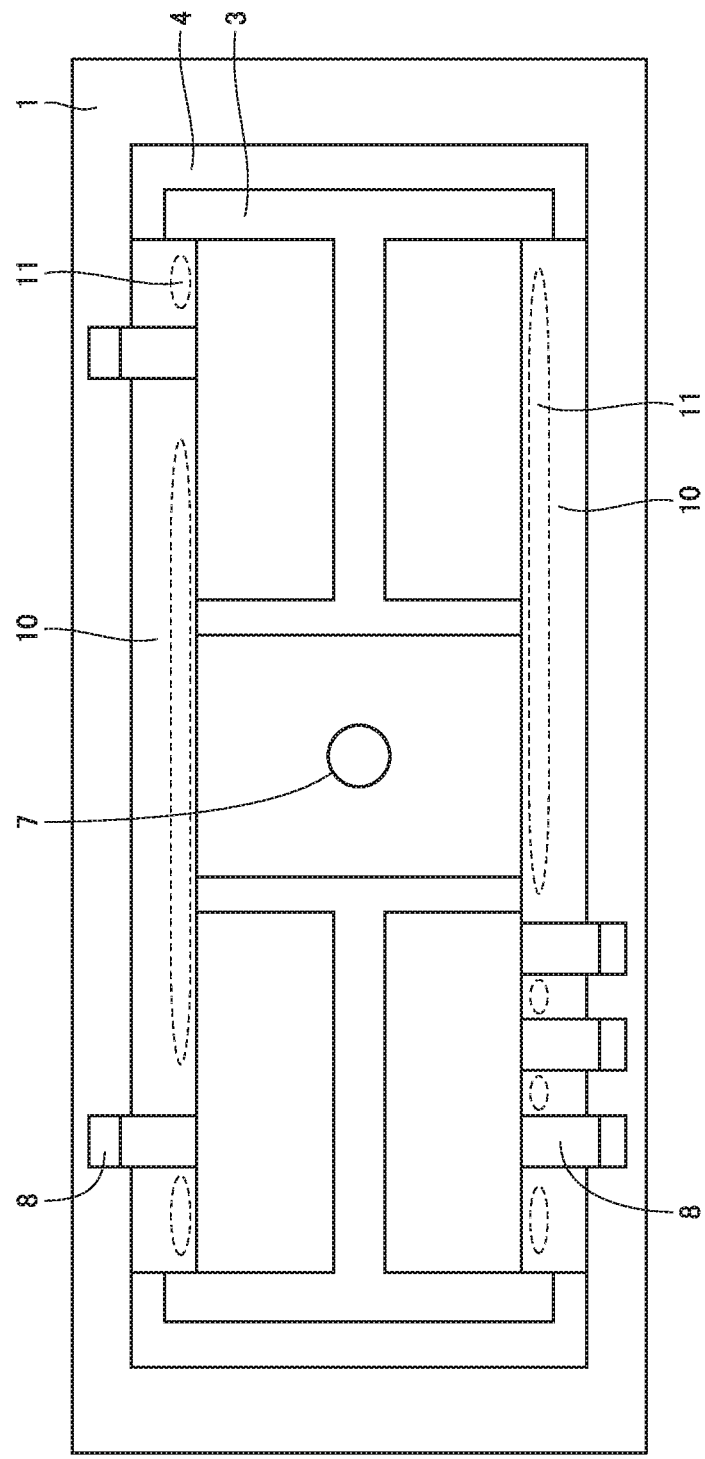
FIG. 15 is a schematic plan view of a configuration of a power module according to a fourth embodiment.

If adhesive 11 should be supplied throughout a region in which protrusion 1E, 10 overlaps upper insulating circuit board 3, the above limitation that spacing G3 between protrusion 1E and upper insulating circuit board 3 is preferably 0.4 mm or less (see FIG. 4) will substantially make no sense any longer. This is because due to adhesive 11 there is no gap at all in a portion in which protrusion 1E, 10 and upper insulating circuit board 3 overlap each other, and sealing material 5 will no longer pass through that portion upward. However, as shown in FIG. 15, adhesive 11 is not supplied throughout the region in which protrusion 1E, 10 overlaps upper insulating circuit board 3, and instead supplied to only a region of a portion thereof, and normally, a region free of adhesive 11 partially remains. Accordingly, it is preferable to control spacing G3, as described above. This is because sealing material 5 flows out through a region partially free of adhesive 11.

For the remainder, the present embodiment is basically similar to the first embodiment, and accordingly it will not be described repeatedly in detail.

Fifth Embodiment

Figure 19:
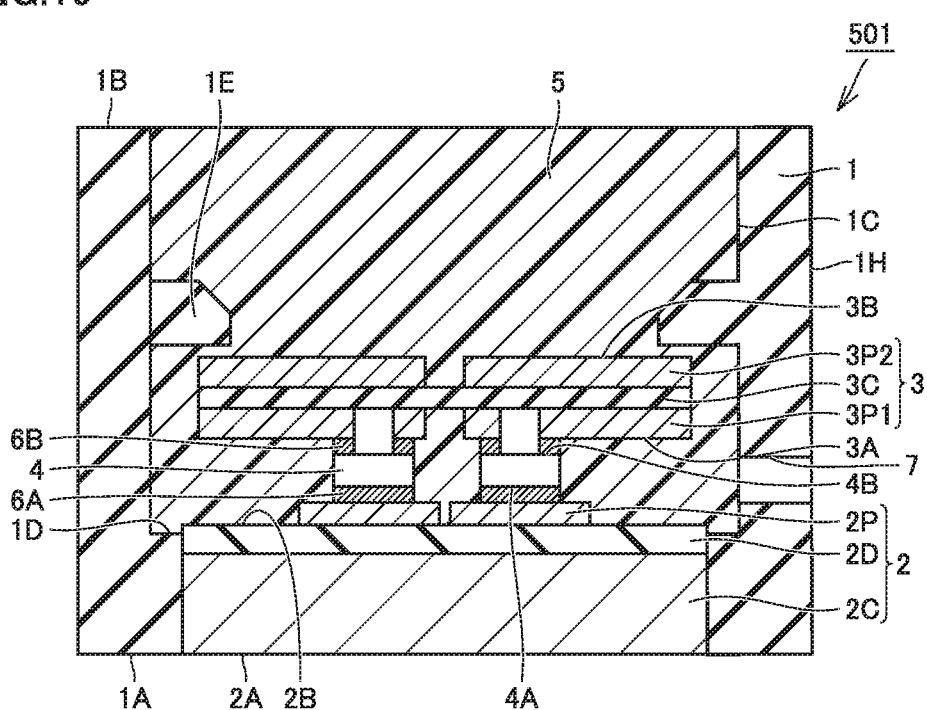
FIG. 19 is a schematic cross section of a configuration including a portion corresponding to a portion on a longer side of a case of a power module of a fifth embodiment taken along line A-A in FIG. 1.

With reference to FIG. 19, a power module 501 of the present embodiment basically has a configuration similar to that of power module 101 of the first embodiment, and accordingly identical components are identically denoted and will not be described repeatedly. Note, however, that in power module 501, injection port 7 is not formed through either upper insulating circuit board 3 or lower insulating circuit board 2, but is formed as a hole through at least a portion of case 1 to extend from an outermost surface 1H of case 1 to reach inner wall surface 1C opposite to outermost surface 1H. Outermost surface 1H corresponds to a side surface located on an outermost side when case 1 is viewed in a plan view, and is opposite to inner wall surface 1C substantially in parallel.

Preferably, injection port 7 is formed at a position which is generally the same, as seen in a vertical direction, as that of a region sandwiched between upper insulating circuit board 3 lower insulating circuit board 2, and preferably, for example, it is formed at a position which is the same, as seen in the vertical direction, as that of semiconductor element 4. Furthermore while in FIG. 19 injection port 7 is formed in a portion on the shorter side of case 1, injection port 7 may be formed in a portion on the longer side of case 1.

In the present embodiment, nozzle NZ is inserted into injection port 7 such that a tip of nozzle NZ is directed inward in a plan view (i.e., toward a side where semiconductor element 4 and the like are disposed), and sealing material 5 is injected therethrough. As well as the other embodiments, this ensures that a narrow region sandwiched between upper insulating circuit board 3 and lower insulating circuit board 2 is supplied with sealing material 5 and can hence be filled therewith densely without a gap.

For the remainder, the present embodiment is basically similar to the first embodiment, and accordingly it will not be described repeatedly in detail.

Sixth Embodiment

Figure 20:
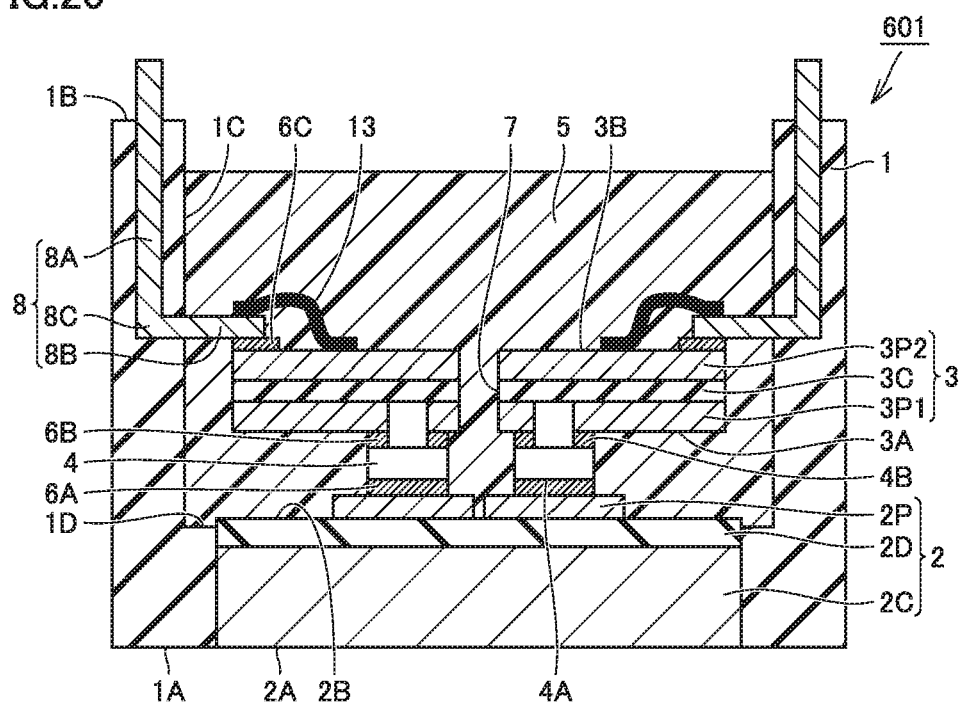
FIG. 20 is a schematic cross section of a configuration including a portion corresponding to a portion on a longer side of a case of a power module of a sixth embodiment taken along line A-A in FIG. 1.

With reference to FIG. 20, a power module 601 of the present embodiment basically has a configuration similar to that of power module 101 of the first embodiment, and accordingly identical components are identically denoted and will not be described repeatedly. However, as presented by power module 601 of the present embodiment, external output terminal 8 and upper surface pattern 3P2 of upper insulating circuit board 3 may be electrically connected via a wire 13. Wire 13 is a thin wire made of aluminum, silver or copper, and is preferably bonded by a generally known wire bonding step, for example. Although not shown, case 1 of the present embodiment is also configured to have protrusion 1E (or protrusion 10), similarly as shown in FIG. 2A, for example.

For the remainder, the present embodiment is basically similar to the first embodiment, and accordingly it will not be described repeatedly in detail.

Seventh Embodiment

In the present embodiment, the semiconductor devices according to the above-described first to sixth embodiments are applied to a power conversion device. Although the present invention is not limited to a specific power conversion device, a case in which the present invention is applied to a three-phase inverter will be described as a seventh embodiment.

Figure 21:
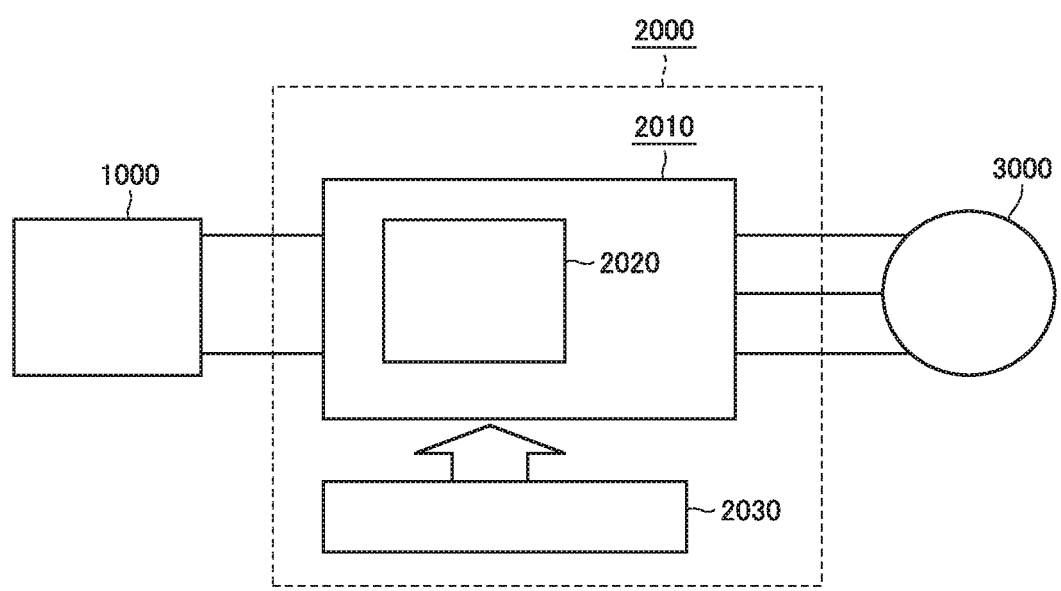
FIG. 21 is a block diagram showing a configuration of a power conversion system to which a power conversion device according to a seventh embodiment is applied.

FIG. 21 is a block diagram showing a configuration of a power conversion system to which a power conversion device according to the present embodiment is applied. The power conversion system shown in FIG. 21 is composed of a power source 1000, a power conversion device 2000, and a load 3000. Power source 1000 is a DC power supply and supplies DC power to power conversion device 2000. Power source 1000 can be composed of a variety of types thereof, e.g., a DC system, a solar battery or a storage battery, or a rectifier circuit or an AC/DC converter connected to an AC system. Further, power source 1000 may be composed of a DC/DC converter which receives DC power output from a DC system and converts it to a predetermined power.

Power conversion device 2000 is a three-phase inverter connected between power source 1000 and load 3000, and power conversion device 2000 receives DC power supplied from power source 1000, converts the DC power to AC power, and supplies the AC power to load 3000. As shown in FIG. 21, power conversion device 2000 comprises a main conversion circuit 2010 which converts received DC power to AC power and outputs the AC power, and a control circuit 2030 which outputs to main conversion circuit 2010 a control signal which controls main conversion circuit 2010.

Load 3000 is a three-phase electric motor driven by AC power supplied from power conversion device 2000. It is to be noted that load 3000 is not limited to a specific application; it is an electric motor mounted in a variety of types of electrical appliances, and is used as, for example, an electric motor for a hybrid car, an electric car, a railway vehicle, an elevator, or an air conditioner.

Hereinafter, power conversion device 2000 will more specifically be described. Main conversion circuit 2010 includes a switching element and a freewheeling diode (not shown), and as the switching element switches, main conversion circuit 2010 converts DC power supplied from power source 1000 into AC power and supplies it to load 3000. Although main conversion circuit 2010 has a variety of types of specific circuit configurations, main conversion circuit 2010 according to the present embodiment is a two-level three-phase full bridge circuit and can be composed of six switching elements and six freewheeling diodes connected to their respective switching elements in anti-parallel. Main conversion circuit 2010 has at least any of the switching elements and freewheeling diodes composed of a semiconductor module 2020 corresponding to any one of power modules 101, 201, 202, and 301 of the above-described first to sixth embodiments. The six switching elements have every two switching elements connected in series to form an upper and lower arm, and each upper and lower arm configures each phase (i.e., a U phase, a V phase, and a W phase) of the full bridge circuit. Each upper and lower arm has an output terminal, that is, main conversion circuit 2010 has three output terminals, connected to load 3000.

Furthermore, main conversion circuit 2010 includes a drive circuit (not shown) which drives at least any of each switching element and each freewheeling diode (hereinafter referred to as "(each) switching element"). However, the drive circuit may be incorporated in semiconductor module 2020, or may be provided separately from semiconductor module 2020. The drive circuit generates a drive signal for driving the switching elements of main conversion circuit 2010, and supplies it to a control electrode of a switching element of main conversion circuit 2010. Specifically, in response to a control signal issued from control circuit 2030, as will be described later, a drive signal which turns on a switching element and a drive signal which turns off a switching element are output to the control electrode of each switching element. When holding a switching element in the ON state, the drive signal becomes a voltage signal equal to or higher than the threshold voltage of the switching element (i.e., an ON signal), whereas when holding a switching element in an OFF state, the drive signal becomes a voltage signal equal to or lower than the threshold voltage of the switching element (i.e., an OFF signal).

Control circuit 2030 controls the switching elements of main conversion circuit 2010 so that load 3000 is supplied with desired power. Specifically, based on power to be supplied to load 3000, control circuit 2030 calculates a time at which each switching element of main conversion circuit 2010 should be turned on (i.e., an ON time). For example, it can control main conversion circuit 2010 by PWM control which modulates the ON time of the switching element in accordance with the voltage to be output. And control circuit 2030 outputs a control command (a control signal) to the drive circuit that main conversion circuit 2010 includes so that the ON signal is output to a switching element to be turned on at each time point and the OFF signal is output to a switching element to be turned off at each time point. In response to this control signal, the drive circuit outputs the ON signal or the OFF signal as a drive signal to the control electrode of each switching element.

In the power conversion device according to the present embodiment, the power module according to the first to sixth embodiments is applied as the switching elements and freewheeling diodes of main conversion circuit 2010, and an effect can be achieved such as better filling a region between lower insulating circuit board 2 and upper insulating circuit board 3 with sealing material 5.

While in the present embodiment an example in which the present invention is applied to a two-level three-phase inverter has been described, the present invention is not limited thereto and is applicable to a variety of types of power conversion devices. While in the present embodiment, the power conversion device is described as a two-level power conversion device, it may be a three-level or multi-level power conversion device, and when supplying power to a single-phase load, the present invention may be applied to a single-phase inverter. In a case where electric power is supplied to a DC load or the like, the present invention can also be applied to a DC/DC converter and an AC/DC converter.

Further, the power conversion device to which the present invention is applied is not limited to the above-described case where a load is an electric motor, and can also be used for example as a power supply device of an electric discharge processing machine, a laser processing machine, or an induction heating cooker or a non-contact device power feeding system, and can even be used as a power conditioner of a photovoltaic power generation system, a power storage system and the like.

The features described in (each example included in) each of the above-described embodiments may be applied in an appropriate combination within a technologically consistent range.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A power semiconductor device comprising:
a casing;
a first insulating circuit board disposed so as to be surrounded by the casing;
a second insulating circuit board surrounded by the casing and spaced from the first insulating circuit board so as to sandwich a semiconductor element between the first insulating circuit board and the second insulating circuit board; and
a sealing material which fills a region surrounded by the casing,
each of the first and second insulating circuit boards having one main surface and another main surface opposite to the one main surface,
the first or second insulating circuit board having a hole filled with the sealing material and extending from the one main surface to reach the other main surface opposite to the one main surface,
an insulative protrusion, which extends to a region overlapping the first or second insulating circuit board in a plan view, extends from at least a portion of an inner wall surface of the casing toward the region surrounded by the casing, wherein
on a straight line extending in a direction normal to the one main surface of the first insulating circuit board and connecting the first and second insulating circuit boards, the second insulating circuit board is located between the insulative protrusion and the first insulating circuit board.

2. The power semiconductor device according to claim 1, further
comprising an external output terminal allowing an electrical signal to be input to and output from the semiconductor element, wherein the external output terminal is buried in the casing and also disposed adjacent to the insulative protrusion.

3. The power semiconductor device according to claim 1, wherein the insulative protrusion is formed with the casing in one piece.

4. The power semiconductor device according to claim 1, wherein the insulative protrusion is provided at the inner wall surface of the casing as a member distinct from the casing.

5. The power semiconductor device according to claim 1, wherein the second insulating circuit board and the insulative protrusion are fixed to each other with an adhesive.

6. The power semiconductor device according to claim 1, wherein from at least a portion of the inner wall surface of the casing a rested portion rested in contact with the other main surface of the first insulating circuit board extends toward the region surrounded by the casing, and the second insulating circuit board and the rested portion are fixed to each other with an adhesive.

7. The power semiconductor device according to claim 1, wherein the casing in a plan view has a rectangular shape having a longer side and a shorter side, and the insulative protrusion extends only from at least a portion of the inner wall surface on the longer side of the casing.

8. A power conversion device comprising:

a main conversion circuit having a power semiconductor device according to claim 1 and configured to convert and output received power; and a control circuit configured to output to the main conversion circuit a control signal which controls the main conversion circuit.

9. A power semiconductor device comprising:

a casing;

a first insulating circuit board disposed so as to be surrounded by the casing;

a second insulating circuit board surrounded by the casing and spaced from the first insulating circuit board so as to sandwich a semiconductor element between the first insulating circuit board and the second insulating circuit board; and a sealing material which fills a region surrounded by the casing, the casing having at least a portion with a hole extending from an outermost surface of the casing to reach an inner wall surface opposite and substantially in parallel to the outermost surface, an insulative protrusion, which extends to a region overlapping the first or second insulating circuit board in a plan view, extends from at least a portion of an inner wall surface of the casing toward the region surrounded by the casing, wherein on a straight line extending in a direction normal to one main surface of the first insulating circuit board and connecting the first and second insulating circuit boards, the second insulating circuit board is located between the insulative protrusion and the first insulating circuit board.

10. A power conversion device comprising:

a main conversion circuit having a power semiconductor device according to claim 9 and configured to convert and output received power; and a control circuit configured to output to the main conversion circuit a control signal which controls the main conversion circuit.

* * * * *